(12) United States Patent
Wong et al.

(10) Patent No.: US 10,868,162 B1
(45) Date of Patent: Dec. 15, 2020

(54) SELF-ALIGNED GALLIUM NITRIDE FINFET AND METHOD OF FABRICATING THE SAME

(71) Applicant: HRL Laboratories, LLC, Malibu, CA (US)

(72) Inventors: Joel C. Wong, Simi Valley, CA (US); David F. Brown, Thousand Oaks, CA (US); Dean C. Regan, Simi Valley, CA (US); Yan Tang, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/120,165

(22) Filed: Aug. 31, 2018

(51) Int. Cl.
*H01L 29/778* (2006.01)
*H01L 29/66* (2006.01)
(Continued)

(52) U.S. Cl.
CPC ...... *H01L 29/7787* (2013.01); *H01L 21/0242* (2013.01); *H01L 21/0254* (2013.01); *H01L 21/0277* (2013.01); *H01L 21/02378* (2013.01); *H01L 21/02389* (2013.01); *H01L 21/02422* (2013.01); *H01L 21/02631* (2013.01); *H01L 21/31053* (2013.01); *H01L 23/3171* (2013.01); *H01L 29/1037* (2013.01); *H01L 29/2003* (2013.01); *H01L 29/205* (2013.01); *H01L 29/4238* (2013.01); *H01L 29/42376* (2013.01); *H01L 29/6653* (2013.01); *H01L 29/66462* (2013.01); *H01L 29/66545* (2013.01); *H01L 29/66795* (2013.01); *H01L 21/0217* (2013.01); *H01L 21/02164* (2013.01);
(Continued)

(58) Field of Classification Search
CPC .......... H01L 29/66545; H01L 29/1037; H01L 29/66795; H01L 29/66462; H01L 21/0254; H01L 21/02422; H01L 21/02389; H01L 21/0277; H01L 21/02378; H01L 21/02631; H01L 29/7787; H01L 29/42376; H01L 29/4238; H01L 29/6653; H01L 29/205
See application file for complete search history.

(56) References Cited

U.S. PATENT DOCUMENTS

| 4,673,960 A | 6/1987 | Chao |
| 5,298,444 A | 3/1994 | Ristow |

(Continued)

OTHER PUBLICATIONS

From U.S. Appl. No. 14/101,102 (now published as U.S. Pat. No. 9,449,833), Notice of Allowance dated May 19, 2016.
(Continued)

*Primary Examiner* — Julia Slutsker
(74) *Attorney, Agent, or Firm* — Ladas & Parry

(57) ABSTRACT

A self-aligned GaN FinFET device and a method of fabricating the same are disclosed. This self-aligned process helps to fabricate GaN FinFET devices in a scalable manner. This work transforms the T-gate process to incorporate fins to further improve pinch-off and decrease leakage currents on highly scaled GaN HEMT structures. The GaN FinFET structure will also allow for integration of normally-off devices with normally-on devices by varying the fin width. The FinFET improvement combines the fin structure consisting of various fin pitches and widths, gate dielectric, self-aligned gate design, ultra-low ohmic contacts, and vertically scaled epitaxy into a single scalable process.

11 Claims, 29 Drawing Sheets

(51) Int. Cl.
| | |
|---|---|
| *H01L 29/20* | (2006.01) |
| *H01L 29/205* | (2006.01) |
| *H01L 21/02* | (2006.01) |
| *H01L 29/423* | (2006.01) |
| *H01L 23/31* | (2006.01) |
| *H01L 29/10* | (2006.01) |
| *H01L 21/027* | (2006.01) |
| *H01L 21/3105* | (2006.01) |
| *H01L 23/29* | (2006.01) |
| *H01L 21/311* | (2006.01) |

(52) U.S. Cl.
CPC ... *H01L 21/02274* (2013.01); *H01L 21/31116* (2013.01); *H01L 23/291* (2013.01)

(56) References Cited

U.S. PATENT DOCUMENTS

| | | | |
|---|---|---|---|
| 5,538,910 | A | 7/1996 | Oku |
| 5,929,467 | A | 7/1999 | Kawai |
| 6,054,355 | A | 4/2000 | Inumiya |
| 6,483,135 | B1 | 11/2002 | Mizuta |
| 6,515,320 | B1 | 2/2003 | Azuma |
| 7,015,518 | B2 | 3/2006 | Kobayashi |
| 8,237,198 | B2 | 8/2012 | Wu |
| 8,383,471 | B1 | 2/2013 | Shinihara |
| 8,558,281 | B1 | 10/2013 | Regan |
| 8,686,473 | B1 | 4/2014 | Mlcovic |
| 8,698,201 | B1 | 4/2014 | Regan |
| 8,841,154 | B2 | 9/2014 | Yoon |
| 8,941,118 | B1 | 1/2015 | Chu |
| 8,946,724 | B1 | 2/2015 | Shinohara |
| 9,449,833 | B1 | 9/2016 | Regan |
| 9,515,161 | B1 | 12/2016 | Shinohara |
| 2008/0128753 | A1 | 6/2008 | Parikh |
| 2008/0169474 | A1 | 7/2008 | Sheppard |
| 2009/0283756 | A1 | 11/2009 | Hellings |
| 2010/0019279 | A1 | 1/2010 | Chen |
| 2010/0117163 | A1 | 5/2010 | Miyashita |
| 2010/0140660 | A1 | 6/2010 | Wu |
| 2010/0301395 | A1 | 12/2010 | Xu et al. |
| 2011/0284865 | A1 | 11/2011 | Inoue |
| 2012/0156836 | A1 | 6/2012 | Shealy |
| 2012/0292665 | A1 | 11/2012 | Marino |
| 2013/0043485 | A1 | 2/2013 | Ueno |
| 2013/0087803 | A1 | 4/2013 | Kizilyalli |
| 2013/0105887 | A1 | 5/2013 | Zuniga |
| 2013/0119400 | A1 | 5/2013 | Shinohara |
| 2014/0027864 | A1 | 1/2014 | Zhu |
| 2014/0091308 | A1 | 4/2014 | Dasgupta |
| 2014/0094223 | A1* | 4/2014 | Dasgupta ............ H01L 29/4236 455/566 |
| 2014/0306235 | A1 | 10/2014 | Decoutere |
| 2017/0092756 | A1* | 3/2017 | Lai .................. H01L 29/785 |
| 2018/0145176 | A1* | 5/2018 | Wei .................. H01L 21/02236 |
| 2018/0337242 | A1* | 11/2018 | Yang ................ H01L 29/41775 |
| 2018/0374927 | A1* | 12/2018 | Liu ................... H01L 21/28088 |
| 2019/0109208 | A1* | 4/2019 | Wang ................ H01L 29/66431 |
| 2019/0355721 | A1* | 11/2019 | Jambunathan ........................... H01L 21/823821 |
| 2019/0355843 | A1* | 11/2019 | Then .................. H01L 29/0847 |

OTHER PUBLICATIONS

From U.S. Appl. No. 14/101,102 (now published as U.S. Pat. No. 9,449,833), Office Action dated Apr. 21, 2016.
From U.S. Appl. No. 14/101,102 (now published as U.S. Pat. No. 9,449,833), Office Action dated Mar. 4, 2016.
From U.S. Appl. No. 14/101,102 (now published as U.S. Pat. No. 9,449,833), Office Action dated Dec. 10, 2015.
From U.S. Appl. No. 14/101,102 (now published as U.S. Pat. No. 9,449,833), Office Action dated Aug. 21, 2015.
From U.S. Appl. No. 14/101,102 (now published as U.S. Pat. No. 9,449,833), Office Action dated Jul. 9, 2015.
From U.S. Appl. No. 14/101,102 (now published as U.S. Pat. No. 9,449,833), Office Action dated May 5, 2015.
From U.S. Appl. No. 14/101,102 (now published as U.S. Pat. No. 9,449,833), Office Action dated Oct. 30, 2014.
Chen, et al., "High-transconductance self-aligned AlGaN/GaN modulation-doped field-effect transistors regrown ohmic contacts", Applied Physics Letters, vol. 73, No. 21 (Nov. 23, 1998), pp. 3147-3149.
Heikman, et al., "Mass transport regrowth of GaN for ohmic contacts to AlGaN/GaN", Applied Physics Letters, vol. 78, No. 19, May 7, 2001, pp. 2876-2878.
Ho, et al., "Monolithic Integration of HEMTS and Shottky Diodes for Millimeter Wave Circuits," 10th Annual GaAs IC Symposium Technical Digest, 1988, Nashville, TN, Nov. 6-9, 1988, p. 301-304, 1988.
Hong, et al., "Low-resistance Ohmic contacts for high-power GaN field-effect transistors obtained by selective area growth using plasma-assisted molecular beam epitaxy", Applied Physics Letters 89, (2006), pp. 042101-1 to 04210-3.
Im, K. et al., "High-Performance GaN-Based Nanochannel FinFETs With/Without AlGaN/GaN Heterostructure," IEEE Transaction on Electron Devices, vol. 60, No. 10, Oct. 2013, pp. 3012-3018.
Kawai, et al., "AlN/GaN insulated gate heterostructure FET with regrown n+ GaN ohmic contact", Electronics Letters, vol. 34, No. 6 (Mar. 19, 1998), pp. 592-593.
Lee, D., et al., "Nanowire Channel InAlN/GaN HEMTs With High Linearity of $g_m$ and $f_T$," IEEE Electron Device Letters, vol. 34, No. 8, Aug. 2013, pp. 969-971.
Lu, et al., "Tri-gate Normally-Off GaN Powre MISFET," IEEE Electron Device Letters, vol. 33, No. 3, Mar. 2012, pp. 360-362.
Micovic, et al., "GaN HFET for W-band Power Applications", 2006 International Electron Devices Devices Meeting Technical Digest, pp. 1-3 (2006).
Moon, et al., "55% PAE and High Power Ka-Band GaN HEMTs With Linearized Transconductance via n+GaN Source Contact Ledge", IEEE Electron Device Letters, vol. 29, No. 8, Aug. 2008, pp. 834-837.
Shinohara, "Scaling of GaN HEMTs and Schottky Diodes for Submillimeter-Wave MMIC Applications," IEEE Transactions on Electron Devices, vol. 60, No. 10, Oct. 2013, pp. 2982-2996.
Shinohara, K., et al. "GaN HEMTS and Schottky Diodes for Sub-Millimeter-Wave MMICs", IMS/RFIC2013 Workshop, Washington State Convention Cneter, Seattle, WA. Jun. 3, 2013.
Shinohara, K., et al. "Self-Aligned-Gate GaN-HEMTs with Heavily-Doped n+-GaN Ohmic Contacts to 2DEG," 2012 International Electron Devices Meeting Technical Digest, Dec. 2012 (4 pages).

* cited by examiner

US 10,868,162 B1

SELF-ALIGNED GALLIUM NITRIDE FINFET AND METHOD OF FABRICATING THE SAME

INCORPORATED BY REFERENCE

This non-provisional application incorporates by reference the contents of U.S. Pat. No. 9,449,833, issued on Sep. 20, 2016 in its entirety including its description of forming self-aligned gate structures on FETs.

TECHNICAL FIELD

The present disclosure is directed in general to transistors and transistors having fin structures, including Fin Field Effect Transistor (FinFET) devices and FinFET high electron mobility transistors (HEMTs).

BACKGROUND OF THE DISCLOSURE

A variety of GaN devices and GaN high electron mobility transistors (HEMTs) are known in the art. Some of these devices include a self-aligned T-gate (gate shaped like the letter "T") on the device. As devices get smaller, leakage current can be an issue even when the device includes an insulating buffer layer as well as implant damage isolation. In some cases, GaN HEMT devices have been found to have high on-resistance with low current density for large sized devices and non-vertically scaled epitaxy.

It can be desirable to improve particular characteristics, such as pinch-off, cut-off frequency, and leakage current for devices. However, scalability and repeatability in the fabrication of these devices can be difficult to achieve, including situations where precise device characteristics are desired.

One approach to improving the characteristics of devices can include fabricating the electron/conductor path as a "fin", allowing a gate to wrap around the fin as in a "FinFET." Gates where the gate wraps around a conductor path, such as a fin, can be described as a "multigate" device, where the gate includes, for example, a horizontal portion along the top of the fin and two vertical portions along two vertical faces of the fin/conductor path. However, alignment of the various features of a FinFET can be difficult, resulting in larger dimensions for such features as the channel length, and poor alignment of the gate in relation to the source and drain, resulting in reduced performance of the device. Accordingly, a way of improving the alignment of the gate within the space between the source and drain as well as a way of reducing the channel length for devices such as FinFET and FinFET HEMT devices is desired.

SUMMARY OF THE DISCLOSURE

In a first aspect, a finned field effect transistor (FinFET) high electron mobility transistor (HEMT) device is provided, the FinFET HEMT comprising: a substrate; a fin etched on the substrate, the fin comprising a channel layer, a first end and a second end; a source fabricated on the substrate and connected to the first end of the fins; a drain fabricated on the substrate and connected to a second end of the fins; and a gate between the source and the drain and extending to three sides of the fin, wherein the gate is fabricated by chemical mechanical planarization (CMP) of a dielectric layer to an upper surface of a sacrificial gate, removing a sacrificial gate to form a gate foot opening and forming a gate foot at least partially in the gate foot opening.

In a second aspect, a method of making a finned field effect transistor (FinFET) high electron mobility transistor (HEMT) device is provided, the method comprising: forming a sacrificial gate across a fin, wherein the fin comprises a channel layer; adding a first and second dielectric wall to a first side of the fin facing a source and a second side of the fin facing a drain; forming source and drain contacts on either side of the sacrificial gate; forming a dielectric layer on the first and second dielectric walls, the source and drain contacts and the sacrificial gate; chemical mechanical planarization (CMP) of the dielectric layer to an upper surface of the sacrificial gate; removing the sacrificial gate resulting in a gatefoot opening; metalizing the gatefoot opening; forming a gate head over the metalized gatefoot opening; and forming source and drain ohmic contacts in electrical communication with the source and drain contacts, respectively.

Certain embodiments may provide various technical advantages depending on the implementation. For example, a technical advantage of some embodiments may include the capability to provide asymmetric gate structure with different gate to source length than the gate to drain length. The gate widths may vary depending on the power handling capacity of the device. The devices may have variable fin lengths and widths to match the requirements for the device.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 3b is a section through the middle of FIG. 3a.

FIG. 3d is a scanning electron micrograph (SEM) of a partially fabricated device at the step of 3a.

FIGS. 5g-5h are SEMs of a partially fabricated device at the step of 5a.

FIGS. 21a-21d are scanning electromicrographs (SEMs) of partially fabricated embodiments of HEMTs as disclosed herein taken at step 9a.

DETAILED DESCRIPTION

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not to scale, except when indicated otherwise by, for example, context.

A self-aligned process technology applicable to FinFET HEMTs having both symmetrical gate spacing and asymmetrical gate spacing is described herein. A self-aligned process, such as that disclosed herein, can define the spacing between the gate and one or more of the contacts by adding (and in some embodiments removing) sidewall spacers between the gate and the contact location. Such an approach can reduce the errors associated with mask misalignment and can allow for shorter dimensions between the gate and contact and/or reduce the variability in this distance.

Utilizing a self-aligning method to fabricate the gate present on a FinFET can facilitate narrower spacing between the source and drain and/or can provide a device with one or more of improved pinch off, improved scalability, reduced current leakage, and integration of normally off and normally on HEMT devices. This self-aligned process can be used to fabricate HEMT devices, such as GaN FinFET HEMT devices, in a scalable manner. This disclosure demonstrates using a T-gate structure with finned conductor paths to further improve pinch-off and decrease leakage currents on HEMT devices, however other gate structures are also possible. The FinFET HEMT devices discussed herein can also allow for integration of normally-off devices with normally-on devices by varying the fin width. The methods and devices disclosed herein can combine a fin structure as a conducting path, such as a channel layer having a 2DEG, where the finned portion of the device can be a single fin or multiple fins arranged in parallel and/or in series. In some embodiments, production of devices having various fin pitches (number of fins per unit of distance) and widths, gate dielectric, self-aligned gate design, ultra-low ohmic contacts, and/or vertically scaled epitaxy can be combined into a single process.

Figure 1A:
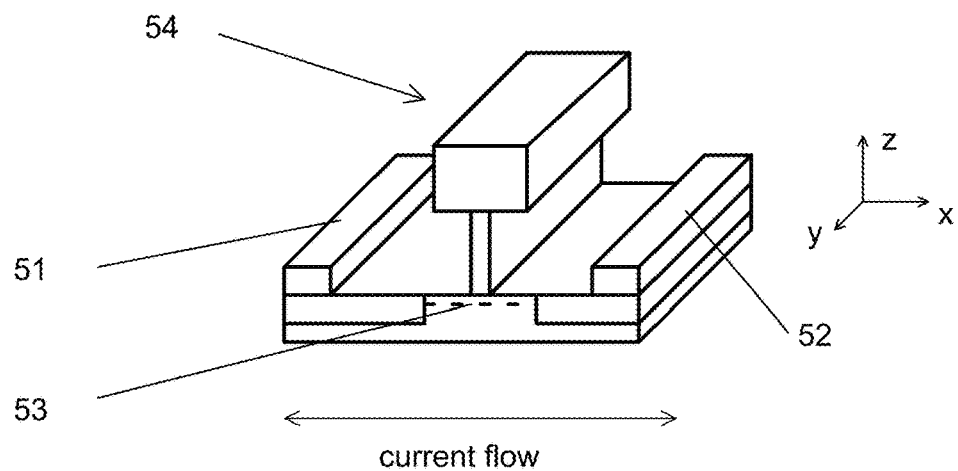
FIGS. 1a-c are schematics of embodiments of high electron mobility transistors (HEMT).
Figure 1B:
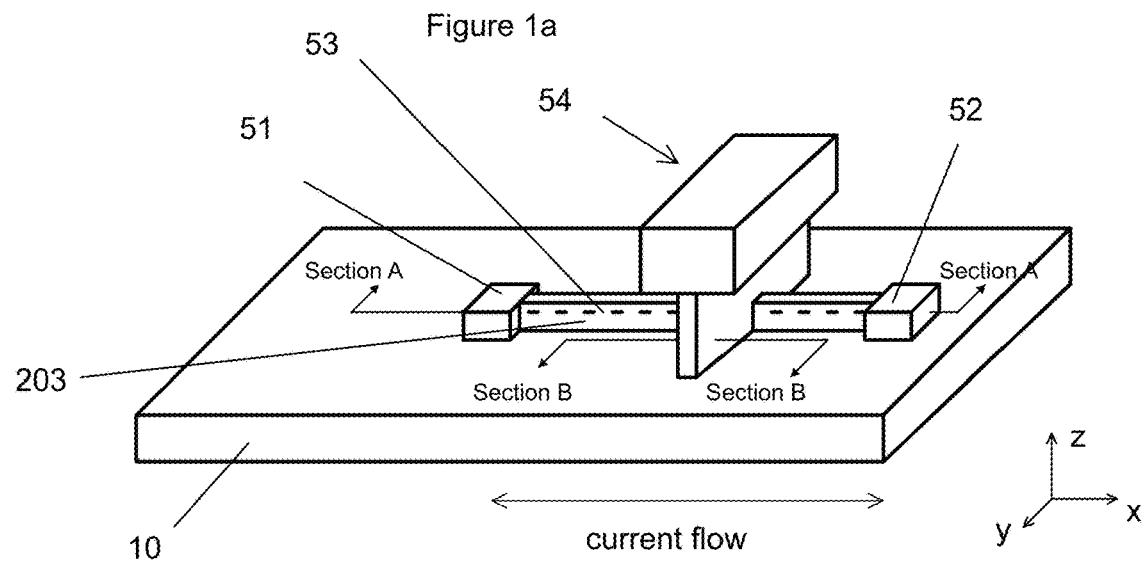
Figure 1C:
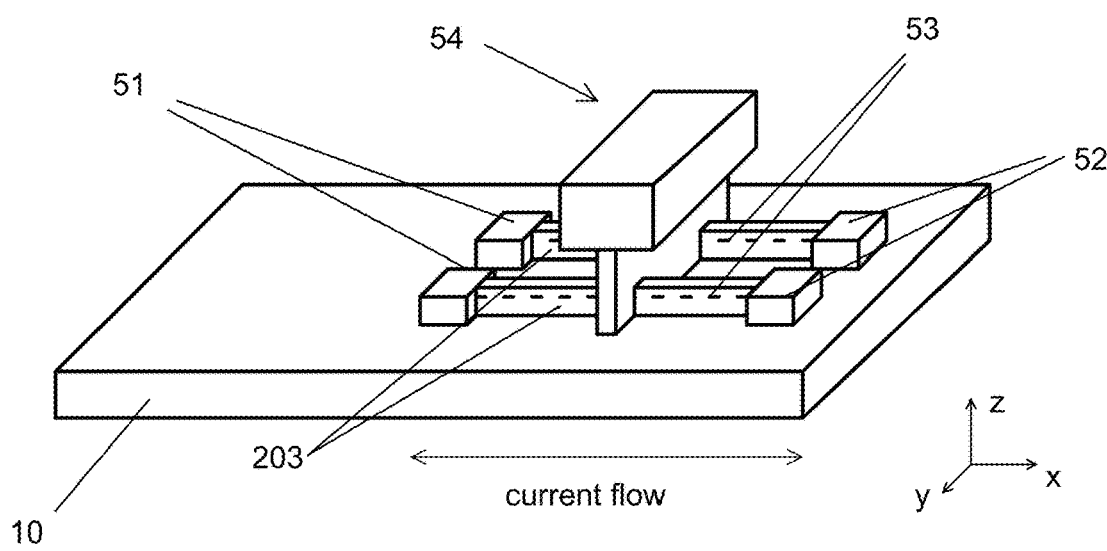

FIG. 1a is a schematic representation of an embodiment of a HEMT device showing a source 51 connected to a drain 52 through a channel layer 53 with a gate 54 in operational communication with the channel 53. FIG. 1b shows a schematic representation of an embodiment of a HEMT where the channel 53 is present in a fin 203 and the gate 54 extends to more than one side of the fin 203, such as to three sides (top and two vertical sides) of the fin 203. As previously discussed, such a device having a gate that extends to multiple sides of the fin 203 can be viewed as a multigate device. Also shown in FIG. 1b are the references for section A-A and section B-B. Generally, except where the context or the description indicate otherwise, the other figures presented herein will be as a section through the location of section A-A, although at different stages of manufacture. Where a figure is a section through the location of section B-B at various stages of manufacture, sufficient context or description will indicate such. Where a figure is a section through a different location, context or description will indicate such. FIG. 1c shows a HEMT device with channels 53 present in multiple fins 203. In FIG. 1c, a single gate 54 is used for multiple fins 203, but separate gates 54 can be used for each fin as well. In addition, FIG. 1c shows distinct sources 51 and drains 52 for each fin. However, when multiple fins 203 are present, a single source and a single drain can be used for more than one fin 203 or distinct sources 51 and drains 52 can be present on each fin 203, or some combination of source and/or drain serving multiple fins and distinct source and/or drain can be used. In some embodiments, multiple sources can be externally connected to one another and/or multiple drains can be externally connected to one another. In additional embodiments, a combination of distinct sources 51, distinct drains 52, interconnected sources 51, interconnected drains 52, common sources 51 and common drains 52 can be present where all of these types are present or only a subset of these types are present. The length of the fin (measured in the direction from source to drain) can determine the effective channel length of the device. The use of a gate which interacts with more than one side of a channel, such as in FIGS. 1b and 1c, can provide improved control of operation of the channel and can help in reducing the leakage current and overcoming other short-channel effects such as degradation of transistor output resistance (Rds), source-drain punch-through and premature breakdown.

In addition, fabrication of a FinFET device, such as a HEMT FinFET, can utilize a self-alignment technique, such as those disclosed herein. In some embodiments, a self-alignment technique can facilitate a shorter gate length than might be possible to achieve with other lithographic alignment techniques. In some embodiments, a gate length of 100 nm, less than 100 nm, less than 90 nm, less than 80 nm, less than 70 nm, less than 60 nm, less than 50 nm, less than 40 nm, less than 30 nm and less than 20 nm can be achieved. Further, use of chemical mechanical planarization (CMP) during the fabrication of the self-aligned gate can facilitate integration of regrown ohmics and/or highly scaled gates within a device and can in some embodiments reduce parasitic capacitance, and regrown n+ GaN ohmic contacts can in some embodiments reduce static and dynamic on-resistance.

In some embodiments, use of a multigate/FinFET device can allow the gate to provide a sharper pinch-off of the channel, and on some devices, such as highly scaled devices, result in significantly reduced leakage paths through the device as well as reducing losses in power and efficiency. In some embodiments, the FinFET devices described herein can allow for higher performance to power ratio and can lead to higher scalability by further reducing short-channel effects as compared to planar devices.

In addition, it can be desirable to have smaller and more efficient GaN HEMT devices which achieve high power and/or high frequencies. However a challenge with FinFET fabrication is the necessity to design the structure in three-dimensions in contrast to planar devices whose third dimension is typically an extension of a single two-dimensional (2D) cross-section of the device. FIGS. 1a-c show this difference among devices along the y-axis for the planar device of FIG. 1a and the finned devices of FIGS. 1b and 1c. In order to repeatedly create such scaled devices, it can be advantageous to use a self-aligned technique utilizing a sacrificial gate concept as described herein to achieve both symmetric and asymmetric gate spacing on the devices. In various embodiments, the self-aligned gate-technology discussed herein can enable fabrication of a self-aligned FinFET structure on a HEMT with high yield, uniformity and controllability. This self-aligned technology can be used to make both symmetric and asymmetric gates and can in some embodiments achieve self-aligned gates and self-aligned ohmic contacts. In some embodiments, CMP planarization processing step can be used and/or highly doped regrown n+ GaN ohmic contacts be formed.

An embodiment of the proposed technology can achieve self-aligned FinFET on GaN HEMT structures, and such structures in some embodiments can allow for more uniform and repeatable fabrication of devices including highly scaled devices. The self-aligned technique described herein can fix the source-drain spacing as well as the gate-source and gate-drain spacing to reduce or eliminate variability in manufacture. This reduced or eliminated variability can in some embodiments allow for tighter control of parasitic capacitance and breakdown voltage for the final device. In addition, other devices can be fabricated on the same wafer as the FinFET HEMTs described herein such as schottky diode and/or planar HEMTs utilizing the same or similar techniques as described herein. Compared to traditional planar HEMTs, including T-gate HEMTs, where the word "T-gate" describes the shape of the gate, the FinFET HEMT can show higher drain efficiency and/or power added efficiency and/or lower leakage while retaining its cut-off frequency characteristics.

The process described below particularly illustrates a process flow for GaN-based HEMT devices, but it is not limited to Gallium Nitride (GaN) but is applicable to other III-V semiconductor material systems such as Gallium Arsenide (GaAs), Indium Phosphide (InP), Indium Antimony (InSb), Indium Gallium Arsenide (InGaSb), Indium Arsenide (InAs), Gallium Antimony (GaSb), Aluminum Gallium Nitride (AlGaN) and Indium Nitride (InN) to name a few. Other materials that can be used in the production of HEMT-type devices are also applicable to these processing steps.

The fabrication process steps of one embodiment comprise:
1) Step 200-1: Selecting a substrate and mounting it on a carrier. Substrate can be of any suitable material, such as sapphire, Silicon Carbide (SiC), Silicon, GaN, etc.
2) Step 200-2: Epitaxial growth of a GaN-HEMT structure on the selected substrate.
   a. Optional: Silicon Dioxide ($SiO_2$) or Silicon Nitride (SiN) passivated HEMT structure
3) Step 200-3: E-beam patterned fin pattern etched into Aluminum Gallium Nitride (AlGaN)/GaN.
4) Step 200-4: (a) E-beam patterned sacrificial gate.
   (b) Gate-source and Gate-drain spacer fabrication
      a. Optional: Sidewall deposition to increase gate-source/drain separation (independent of fin width), such as by plasma-enhanced chemical-vapor-deposition (CVD) or atomic layer deposition (ALD).
      b. Optional: Sidewall removal for asymmetric gate-source/drain separation, such as by e-beam lithography to expose the source side of the sacrificial gate and then etching the sidewall, for example by an isotropic CF4-based dry etch or other fluorine-based dry etch.
      c. Preparation of contacts, for example by n+ GaN ohmic contacts regrowth, ion implantation of Si, or other appropriate means.
5) Step 200-5: Removal of E-beam patterned sacrificial gate spacer after CMP planarization
6) Step 200-6: Gate length adjustments for a symmetric or asymmetric gate structure.
7) Step 200-7: Gate-foot etching, gate & ohmic metallization, and gate passivation deposition
   a. Optional: Gate dielectric depositions
   b. Gate length shrinking via sidewall deposition The steps of this embodiment of a process of this disclosure can start with step 200-1 by selecting a SOI type substrate such as silicon dioxide ($SiO_2$) over Si, though other types of substrates such as SiC, GaAs, InP, Si, and InSb can be used as well. In process step 200-2, an $SiO_2$ over Si is selected as the SOI substrate and GaN is grown epitaxially over the substrate to create a GaN layer. An AlGaN layer is then grown on the GaN layer. An optional passivation layer can be added on top of the AlGaN layer. The passivation layer can be created comprising $SiO_2$, however SiN or other dielectric material suitable for use as a passivation layer can also be used.

Step 200-3 etches one or more fins into the GaN/AlGaN epitaxial layer. Any known etching technique can be used, including e-beam lithography. The fins can be of any width and length as desired for any given device. A channel layer having a 2 dimensional electron gas (2 DEG) can be present near the interface of the GaN and AlGaN layers. In a preferred embodiment, fin length of about 50 nm with a fin height of 20 nm is used. More than one fin can be fabricated in a device.

In step 200-4, an e-beam patterned sacrificial gate can be made that crosses the fin or fins, when present, and can be located over the channel layer when fins are not present. Suitable materials for the sacrificial gate include hydrogen silsesquioxane (HSQ), but other materials can be used as well. (The sacrificial gate can be located so as to assist in aligning the source and drain in relation to the gate.) In addition, dielectric layers or sidewalls can be added to the vertical sides of the sacrificial gate. For example, a dielectric sidewall can be added using PECVD deposition followed by an anisotropic CF4-based dry etch (or other fluorine-based dry etch), to preferentially etch vertically and remove horizontal surfaces, which can result in removing the dielectric from the top surface of the HSQ and form the field area on the GaN surface, but leaving the dielectric on the sidewalls of the HSQ. In some embodiments, a sidewall can be added to one vertical side. In some embodiments, a sidewall can be added to each side vertical side. In some embodiments of a device without fins, a sacrificial gate can be fabricated with a sidewall on one vertical side or on two vertical sides of the sacrificial gate. The sidewalls can be any suitable dielectric material, such as SiN or $SiO_2$. Side walls associated with the sacrificial gate structure can also be dry-etched using carbon tetrafluoride ($CF_4$) based etching chemicals or other suitable etching chemicals. However in some preferred embodiments, an etch can be performed to preferentially etch surfaces other than the sidewalls, such as by using $CF_4$ in a dry plasma-based etch.

The e-beam lithography of the sacrificial gate can allow fabrication of nanometer scale structures such as the sacrificial gate on any given layer. In some embodiments, the area for the channel (and 2DEG), such as the area where fins are, can be coated with SiN and then this area, whether coated with SiN or not, can be coated with a resist followed by an e-beam step which exposes the areas where the resist will be retained during future processing steps (alternatively, the areas exposed can be the areas that are removed during further processing steps while the non-exposed areas are retained.) In some embodiments, the e-beam can expose the area where the sacrificial gate 250 will be located. In some embodiments, the resist can be hydrogen silsesquioxane (HSQ) and the resist can be spin-coated to the areas that need to be covered with HSQ. Following coating with resist and exposure, a solvent such as tetramethylammonium hydroxide (TMAH) is used to dissolve all areas of HSQ or other mask material the e-beam did not expose. After optionally depositing dielectric, such as SiN, on the sides of the remaining HSQ or other mask material, the result can be a sacrificial gate or "island" with SiN on the side walls and HSQ as the sacrificial gate. The side walls and the core of the sacrificial gate can be of any other suitable material as well.

Step 200-5, can include one or more of regrowing n+GaN contacts, depositing dielectric, planarizing to the top of the sacrificial gate, and removal of the sacrificial gate. In addition, at this step, adjustment of the gate-source and/or gate-drain separation (increase or decrease) can be done to fabricate asymmetric or symmetric gate structures. this step can comprises:

(a) Regrowth of an n+GaN (or other appropriate material) contact layer using techniques such as Molecular Beam Epitaxy (MBE), for the source and drain.

(b) A layer of SiN (or other appropriate dielectric material) can be deposited on the n+GaN layer, by any appropriate technique such as PECVD or sputtering. In some embodiments, the SiN can be deposited over the HSQ as well as the n+GaN and the level built upon on the n+GaN can be lower than, higher than or equal to the top of the sacrificial gate.

(c) The top of the device can be planarized, such as by chemical mechanical planarization (CMP). In some embodiments, the planarization can expose the top of the sacrificial gate. In some embodiments, the planarization can be to the top of the sacrificial gate.

(d) The sacrificial gate (HSQ material) can be removed by a solvent such as hydrofluoric acid (HF).

(e) Side walls previously associated with the sacrificial gate can also optionally be dry-etched using carbon tetrafluoride ($CF_4$) based etching chemicals or other appropriate etching chemicals.

Next, optional process step 200-6 can be used to further adjust the gate length parameters. The gate-to-source and/or gate-to-drain lengths can be reduced or increased individually by either depositing suitable materials such as SiN on the side walls of the gate opening 211 or removing side walls by using dry-etching materials such as carbon tetrafluoride ($CF_4$) based etching chemicals. This step can optionally be followed by a coating of $SiO_2$. This step 200-6 can adjust the gate foot dimensions and location to result in a thinner gate foot (as measured along the current path of the device) and/or can define an asymmetric or symmetric gate structure.

Process step 200-7 can prepare the gate-foot opening and can metalize the gate and ohmics, and can optionally passivate the gate to create a GaN FinFET or a planarized GaN device with the desired device characteristics. Step 200-7 can comprise one or more of the following sub-process steps:

(a) Vertical plasma dry etching to remove $SiO_2$ at the bottom of the gate opening. This can prepare the narrow head of the gate area for metallization.

(b) Gate metal deposition by using methods such as atomic layer deposition or other suitable methods.

(c) Masking and e-beam patterning a gate head followed by depositing the material of the gate head (gold or other suitable material) and removal of the remaining mask and exposed metallization layer.

(d) Patterning and deposition of ohmic contact material over the source and drain.

In some GaN FinFET devices, the source and drain can both be or comprise n+GaN type materials. The gate height can be about 200 nm and the gate length is typically about 50 nm. The fins are about 50 nm long and about 20 nm in height. The source to drain and source can be between 120 and 200 nm long. However, larger or smaller dimensions can be used as well such as a gate length of up to 225 nm or 25 nm or larger. The gate width can be selected depending on the power handling capacity of the device.

Below is a more detailed discussion of an embodiment of a process for making a FinFET HEMT (and planar HEMT) which can include steps different or in addition to those described above.

Figure 2:
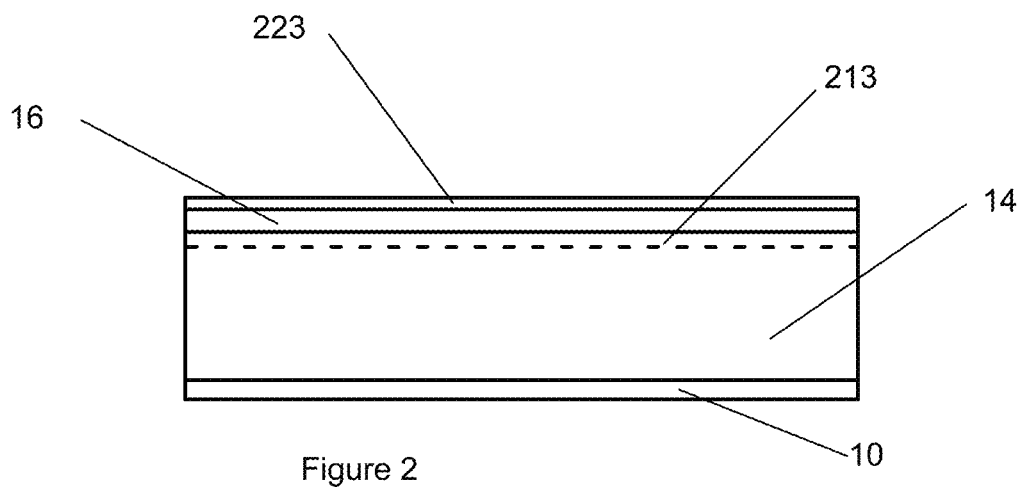
FIG. 2 is a section of a partially fabricated embodiment of a HEMT as disclosed herein taken through the location of Section A-A as shown in FIG. 1b.

FIGS. 2 through 15*b* describe an embodiment of a self-aligned FinFET fabrication process. These figures show schematically the fabrication steps of several embodiments of a FinFET HEMT. The description of these figures references a GaN/AlGaN device. However, as noted above, other suitable materials such as Gallium Arsenide (GaAs), Indium Phosphide (InP), Indium Antimony (InSb), Indium Gallium Arsenide (InGaSb), Indium Arsenide (InAs), Gallium Antimony (GaSb), Aluminum Gallium Nitride (AlGaN) and Indium Nitride (InN) and the like which can be used for HEMT devices can be used as well. FIG. 2 shows a substrate 10 with GaN 14 and AlGaN 16 grown epitaxially on the substrate and an optional passivation layer 223 (SiN, $SiO_2$ or other dielectric material.) A channel layer 213 with a 2 dimension electron gas (2DEG) is present in the GaN layer 14.

As shown in FIG. 2, an embodiment of a GaN-HEMT structure is grown epitaxially, preferably by Molecular Beam Epitaxy (MBE) or Metal Organic Chemical Vapor Deposition (MOCVD), on a suitable substrate 10, such as sapphire, SiC, silicon, GaN, etc. The HEMT epitaxial layers can comprise an AlGaN back barrier layer (not shown) disposed on substrate 10, a GaN layer 14 with channel 213 disposed on back barrier layer, an AlGaN top barrier layer 16 disposed on GaN layer 14, and finally an optional epitaxial cap layer (not shown) applied over the top barrier layer 16 comprising either AlGaN or GaN, layers 14 and 16 (and optional back barrier and epitaxial cap layer) can be preferably grown by MBE or MOCVD. Other suitable materials can be utilized for these layers. For example, back barrier layer when present can alternatively be GaN or InGaN/GaN, etc., layer 14 can alternatively be InGaN, AlGaN, or InAlGaN, etc. (or combinations thereof) and top barrier layer 16 can alternatively be AlN or InAlN, etc. The thickness of layer 16 is preferably about ⅕ of the gate length of the HEMT to suppress the short channel effect, however other thicknesses can be used. The thickness of the layer 14 preferably ranges from about 3 nm to about 40 nm while the thickness of layer 16 preferably ranges from about 1 nm to about 20 nm, however other thicknesses can be used as well.

A Two Dimensional Electron Gas (2DEG—see the dashed line in FIG. 2) occurs in layer 14 due to a polarization effect caused by the top barrier layer 16 or a combination of the top barrier layer 16 and the optional epitaxial cap layer 18. The 2DEG channel is formed immediately at interface between layer 14 and layer 16 as soon as the top barrier 16 is deposited of on top of layer 14 as shown in FIG. 1 a.

Also shown in FIG. 2 is a passivation layer 223, such as $SiO_2$, SiN, etc., that can optionally be applied on top of the optional cap layer (or on top of the top barrier layer 16 if no cap layer is used) using a deposition technique such as plasma enhanced chemical vapor deposition (PECVD) or atomic layer deposition (ALD). This passivation layer 223 can be used, for example, to protect the semiconductor surface (either layer 16 and/or optional cap layer) thereby preventing a reaction between layer 24 (see FIGS. 7a and c) and optional cap layer (or layer 24 and layer 16) during the ohmic regrowth step described with reference to FIGS. 7a and b below. A reaction between layer 24 and optional cap layer (or layer 16) can form an undesirable current leakage path at the interface. The insertion of this passivation layer 223 can prevent a leakage current from occurring between the gate and the source or the gate and the drain, through this interface, and therefore the use of this passivation layer 223 is preferred.

Figure 3A:
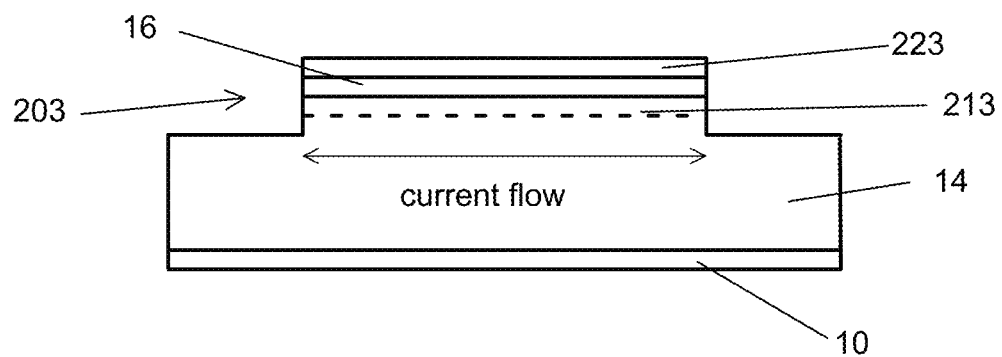
FIG. 3a is a section of a partially fabricated embodiment of a HEMT as disclosed herein taken through the location of Section A-A as shown in FIG. 1b.
Figure 3B:
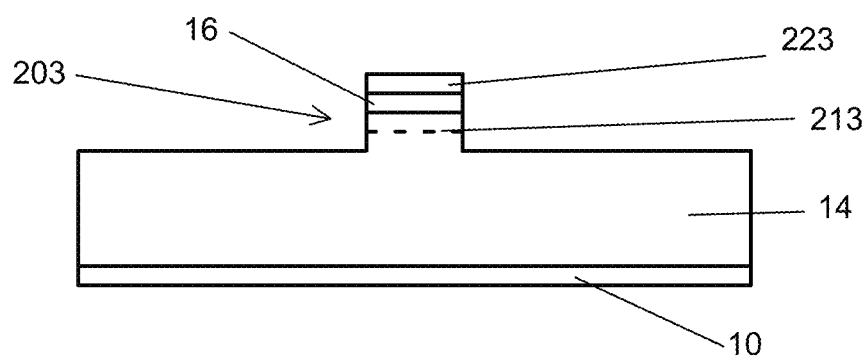

A fin is then etched into layers 14, 16 and 213. FIG. 3a shows Section A-A (ref. FIG. 1b) of an embodiment of the FinFET HEMT device after fabricating the fin. Any known patterning technique can be used, including e-beam lithography. The fins 203 can be of any width and length as desired for any given device. FIG. 3a shows the cross section taken along a fin 203 for the FinFET structure and FIG. 3b is a cross-section through the middle of fin 203. An optional passivation layer 223 is shown on the AlGaN layer 16. In some embodiments, a portion of a wafer being used to make a FinFET HEMT can be reserved for fabricating a planar GaN HEMT device with no fins. The channel layer 213 for a planar device can be located as in FIG. 2. In the preferred embodiment, fin length can be about 50 nm and fin height can be about 20 nm, but other fin lengths can be used, such as 100, 90, 80, 70, 60, 40, 30, 20 and 10 nm as well as ranges defined between these dimensions, and fin heights of 50, 40, 30 and 10 nm as well as ranges defined between these dimensions. Fins can be etched into AlGaN/GaN type base materials.

Figure 3C:
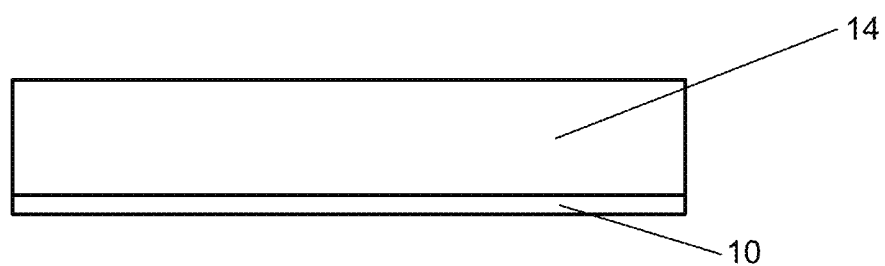
FIG. 3c is a section of a partially fabricated embodiment of a HEMT taken through the location of Section B-B as shown in FIG. 1b.
Figure 3D:
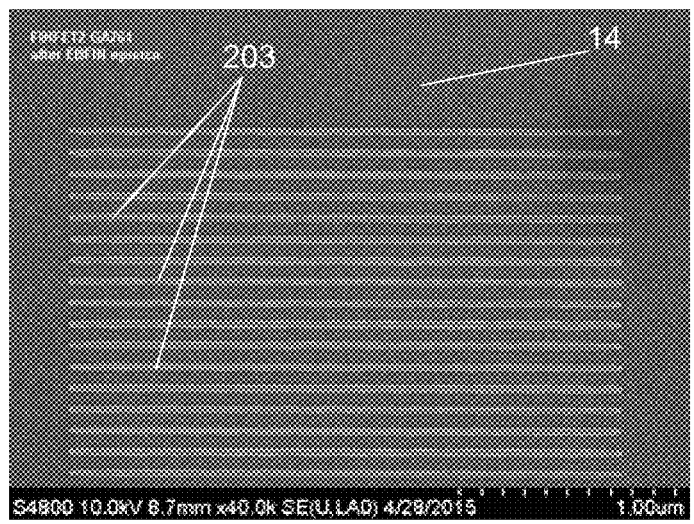

FIG. 3c shows Section B-B (ref. FIG. 1b) of an embodiment of the FinFET HEMT device at the same stage of fabrication as FIG. 3a. FIG. 3d shows an SEM of a partially fabricated device at the same step of fabrication as FIG. 3a, showing multiple fins extending from the surface 14.

Figure 4A:
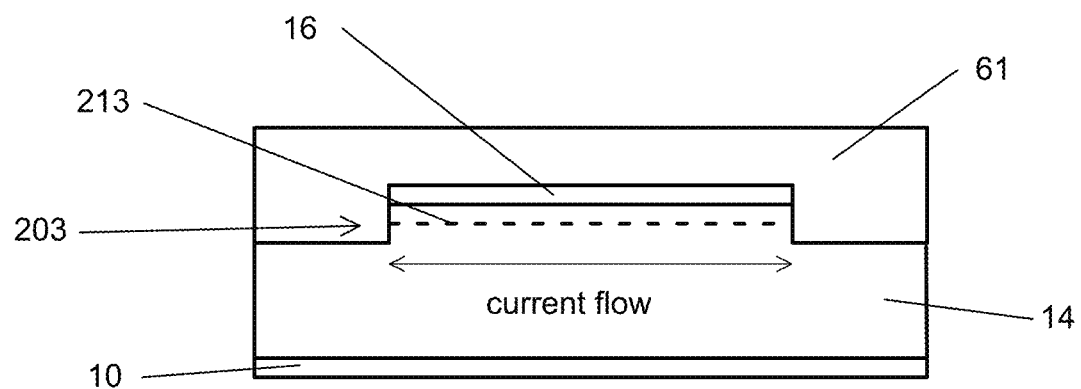
FIGS. 4a and 4b are sections of a partially fabricated embodiment of a HEMT as disclosed herein taken through the location of Section A-A as shown in FIG. 1b.
Figure 4B:
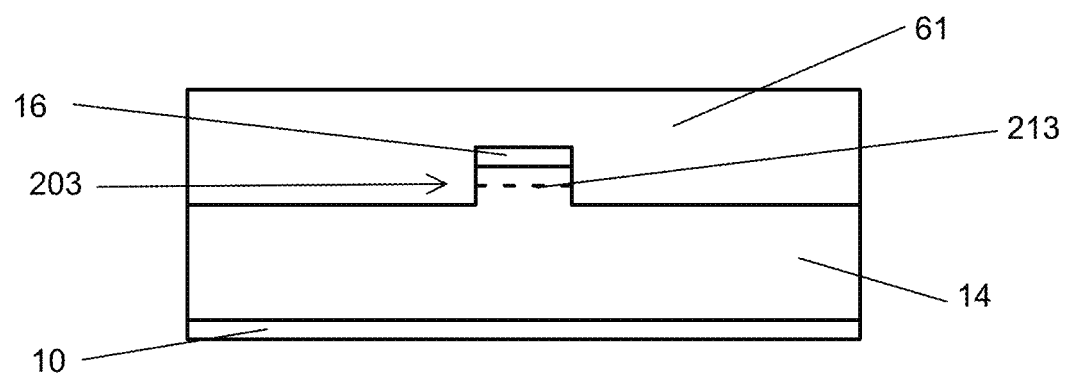
Figure 5A:
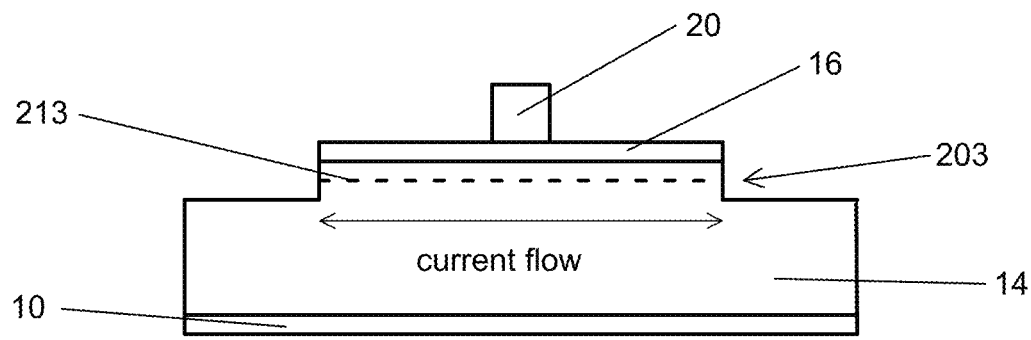
FIGS. 5a-5f are sections of partially fabricated embodiments of HEMTs as disclosed herein taken through various locations for various versions of devices.
Figure 5B:
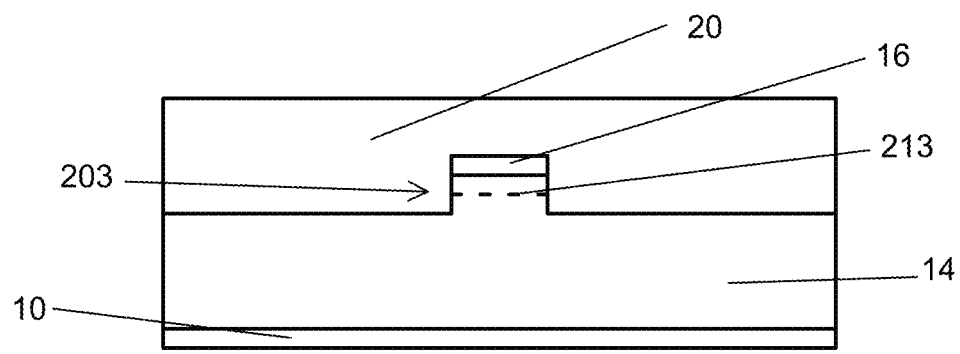
Figure 5C:
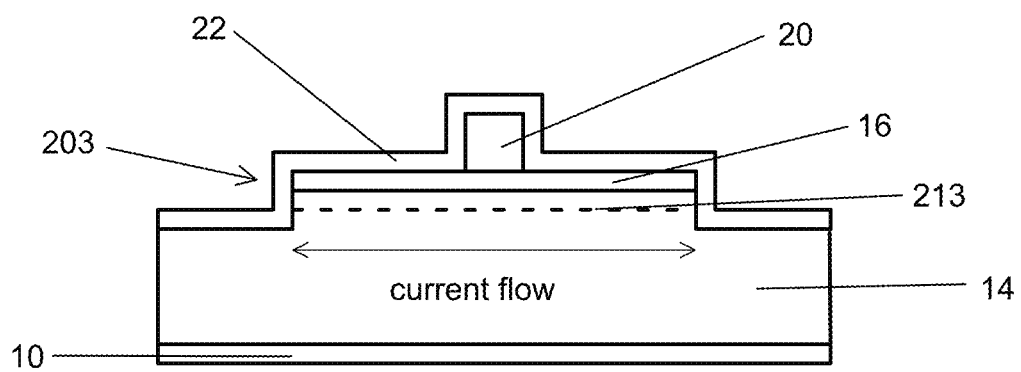

FIG. 5a shows sacrificial gate 20 located on fin 203. A sacrificial gate 20 can be formed in some embodiments by initial patterning accomplished by laying down a layer of a EBeam resist 61 (preferably hydrogen silsesquioxane (HSQ) is used as the EBeam resist) as shown in FIG. 4a (FIG. 4b shows a cross-sectional view through the middle of FIG. 4a), which is patterned into a sacrificial gate 20 or "island" of EBeam resist preferably using E-beam lithography to define the island 20 as shown by FIG. 5a. The thickness of island 20 is preferably about 3500 Å, while the width of island 20 (which, as will be seen, helps control the width of the stem of a T-shaped gate) typically should range from about 60 nm to about 200 nm. However, other dimensions can be used as well. If desired, $SiO_2$ may be used instead of HSQ as the material to form island 20, but the use of $SiO_2$ will likely involve additional processing steps compared to using HSQ in order to form island 20 as is described herein. FIG. 5b is a cross-sectional view through the middle of FIG. 5a.

In various embodiments of a method of making a self-aligning gate device, such as those disclosed herein, the sacrificial gate 20 and/or sidewalls 22S, 62, 62L or 62R can be used to define an edge of one or both of the contacts, such as doped contacts 24, prior to removal of the sacrificial gate and/or sidewalls. The edge of one or both contacts, such as doped contacts 24, can then be used to define the location of the gate stem 30STEM or gate foot 30F. In some embodiments, additional deposition steps, such as where mask or dielectric layers are deposited onto the edge(s) of the contact(s) being used to define the location of the gate stem/gate foot, to narrow the space into which the gate foot/gate stem is deposited. In various embodiments, this approach can result in the relative placement of the gate stem/gate foot and the contact(s) without patterning of both the gate foot/gate stem and the contact(s). As a result, the placement of the gate foot/gate stem in relation to the contact(s) can be more accurate than when the both the gate foot/gate stem location and the contact(s) location are determined by patterning of the gate foot/gate stem and patterning of the contact(s).

Figure 5D:
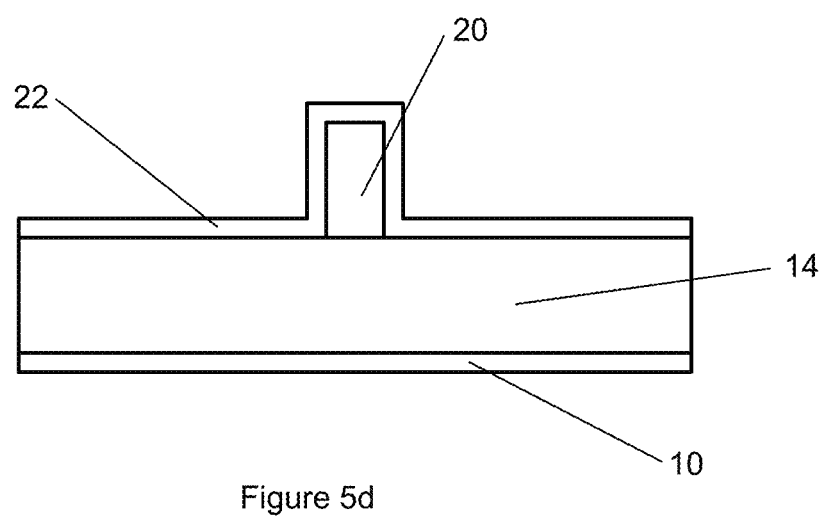

In some embodiments, an asymmetric gate location can be desired. When such an asymmetric gate location is desired, a sacrificial dielectric layer 22 such as Si, $SiO_2$, SiN, SiON, $Al_2O_3$, $HfO_2$, ZrO, $TiO_2$, using a deposition technique such as chemical vapor deposition (CVD) or ALD, can be applied over the exposed structure of FIG. 5a resulting in the structure shown by FIG. 5c (FIG. 5d is a section through the location of Section B-B of FIG. 1b at the same point of manufacture as FIG. 5c). This layer 22 can be used to define a sidewall 22S on one side of the sacrificial gate 20 as shown in FIG. 5g, which results in sidewall 22S offsetting the position of the gate stem $30_{STEM}$ asymmetrically. Accordingly, the thickness of the sacrificial dielectric layer 22 (equal to the width of the sidewall 22S) can be used in controlling the size or extent of that offset. The thickness of layer 22 can preferably be in the range of 50 nm to 300 nm, although other thicknesses can also be effectively used.

Figure 5E:
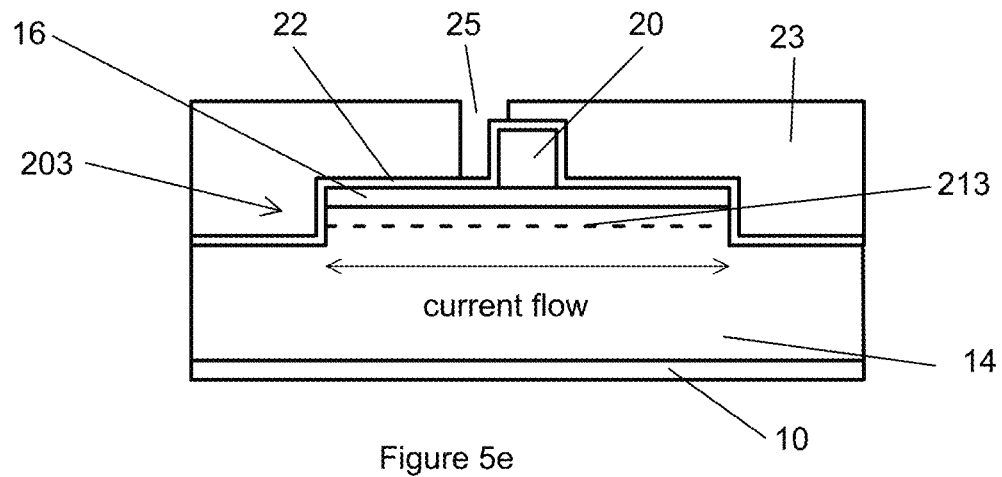
Figure 5F:
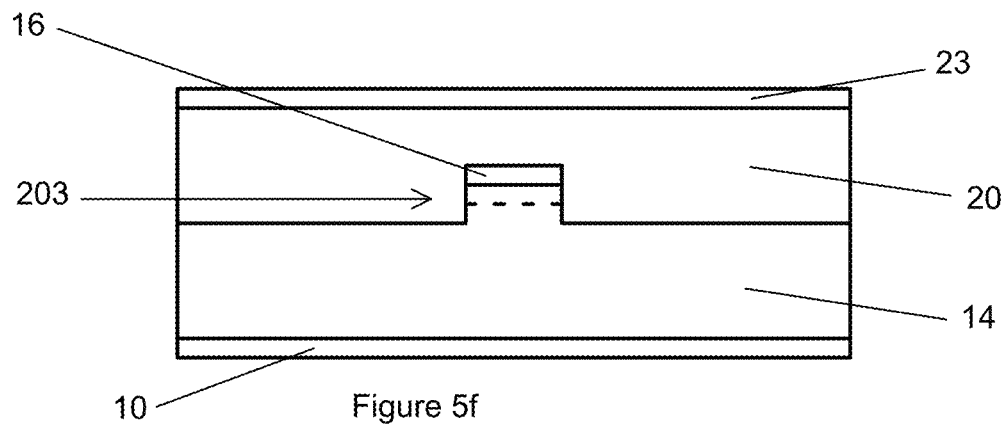
Figure 5G:
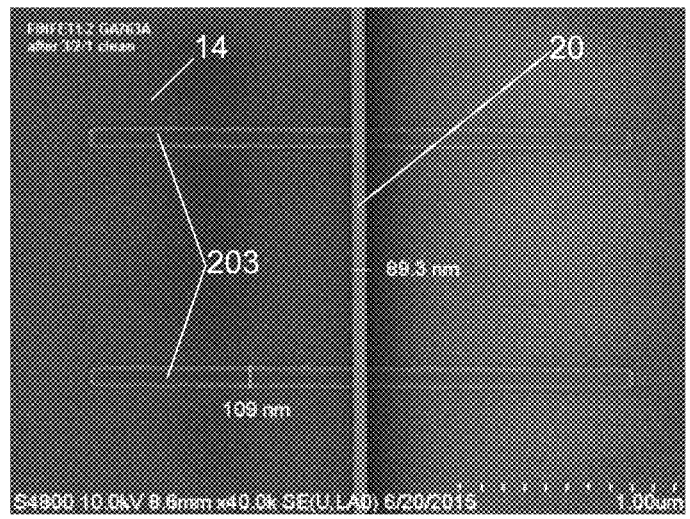

For an optional asymmetric gate positioning, a mask layer 23 (preferably a PMMA resist) can be applied over the sacrificial dielectric layer 22 described above for FIG. 5c, followed by lithographic patterning, preferably using electron beam lithography, to define an opening 25 as shown in FIG. 5e. FIG. 5f is a cross-sectional view through the middle of FIG. 5e. Then the sacrificial dielectric layer 22 visible through opening 25 can be etched away preferably using an isotropic dry etch—such as a Reactive Ion Etch (ME) or an Inductively Coupled Plasma ME (ICP-RIE) etch technique, preferably using a $CF_4$ and $O_2$ gas mixture (or other fluorine-based dry etch)—through the opening 25 in the resist mask layer 23. This etch of layer 22 can be preferably timed to not cause any damage or any significant damage to layer 16.

The resist mask layer 23 can then be removed using a suitable mask remover. The horizontal portions of sacrificial dielectric layer 22 can then be removed by first subjecting the device to an appropriate etch, such as an isotropic RIE/ICP ME etch by a $CF_4/O_2$ gas mixture at high pressure (e.g., 90 mTorr in the etch chamber) to partially etch away layer 22 followed by anisotropic RIE/ICP RIE etch by $CF_4$ gas at a low pressure (e.g., 3 mTorr in the etch chamber) to etch what remains of the SiN layer 22 vertically, leaving behind a sidewall 22S of sacrificial dielectric, such as SiN, deposited preferably on the drain side of the gate However, in some embodiments, the sidewall 22S can be present on the source side of the gate. This etch will etch island (or sacrificial gate) 20 slightly in a vertical direction; however, the lateral width of island 20 will not be changed due by any vertical etching caused by this anisotropic RIE/ICP ME etch.

Figure 5H:
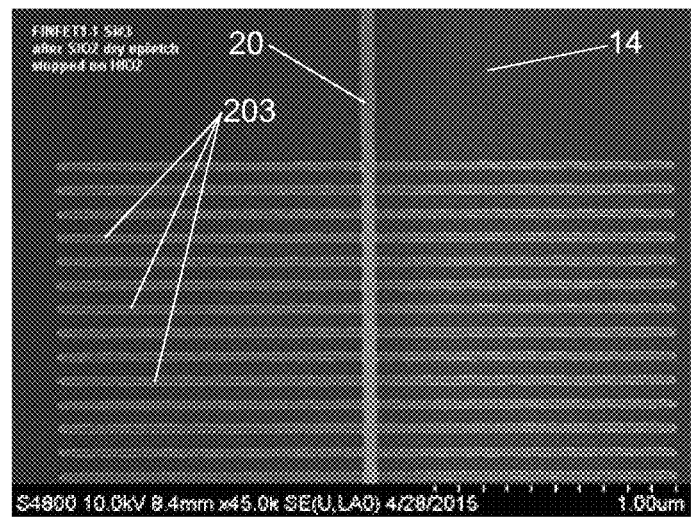

The sidewall 22S on, for example, what will be the drain side of the gate which is preferably all that remains of the original sacrificial dielectric layer 22 in this embodiment after the isotropic and anisotropic etches of the sacrificial dielectric layer 22 as described above. However, after the processing shown and described with reference to FIG. 5e, the relevant processing steps occurring between FIG. 5a and FIG. 5e (including the subsequent etch) can be optionally repeated (and modified as need be) to form additional sidewalls 62 on the left-side of the island 20 and on the right-side of sidewall 22S, which additional sidewalls 62 can be used to control an electric field profile between the gate and the source as well as the gate and the drain to increase breakdown voltage or control gate capacitances for improved high frequency performance of the resulting device. FIGS. 5g and 5h are SEMs of partially fabricated devices at the same step of manufacture as FIG. 5a, showing 2 fins 203 (FIG. 5g) and 14 fins 203 (FIG. 5h) extending from the surface 14 and a sacrificial gate 20 across the gates.

Figure 6A:
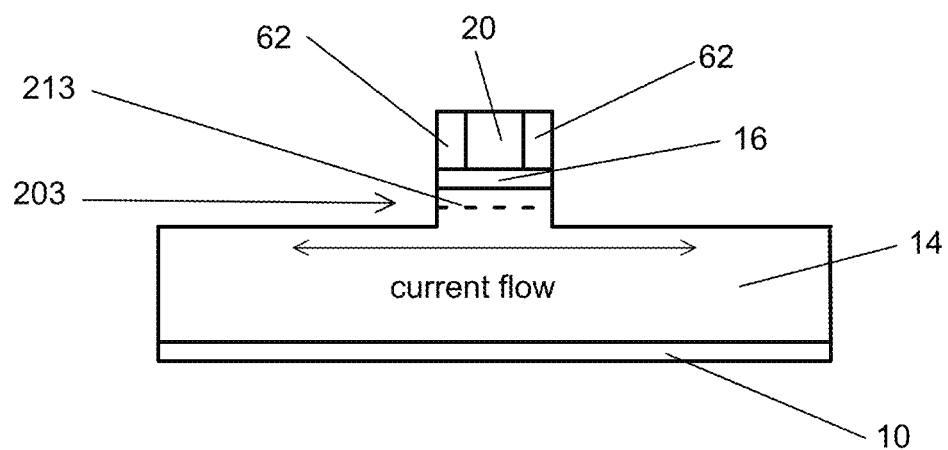
FIGS. 6a-6d are sections of partially fabricated embodiments of HEMTs as disclosed herein taken through different locations for various versions of devices.
Figure 6B:
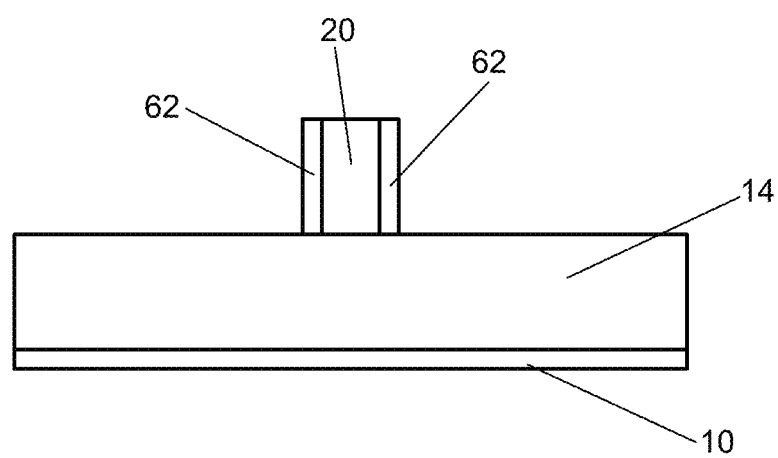
Figure 6C:
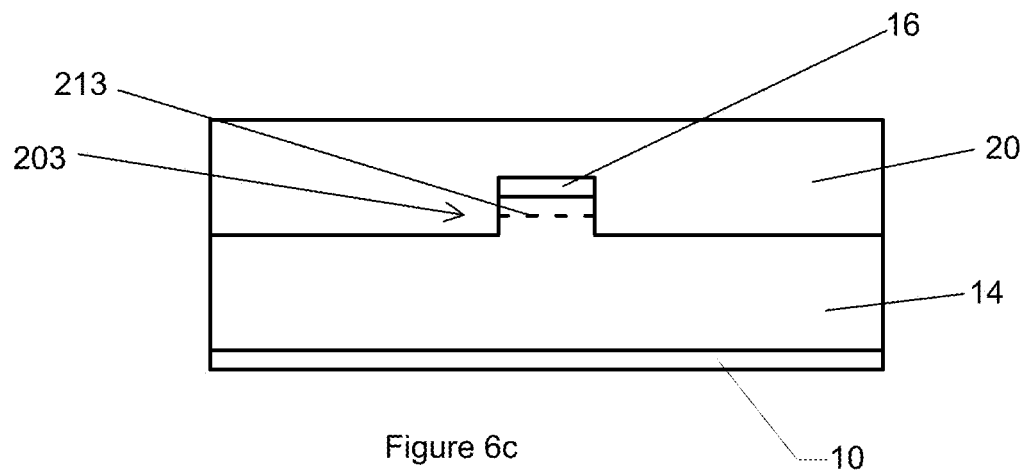
Figure 6D:
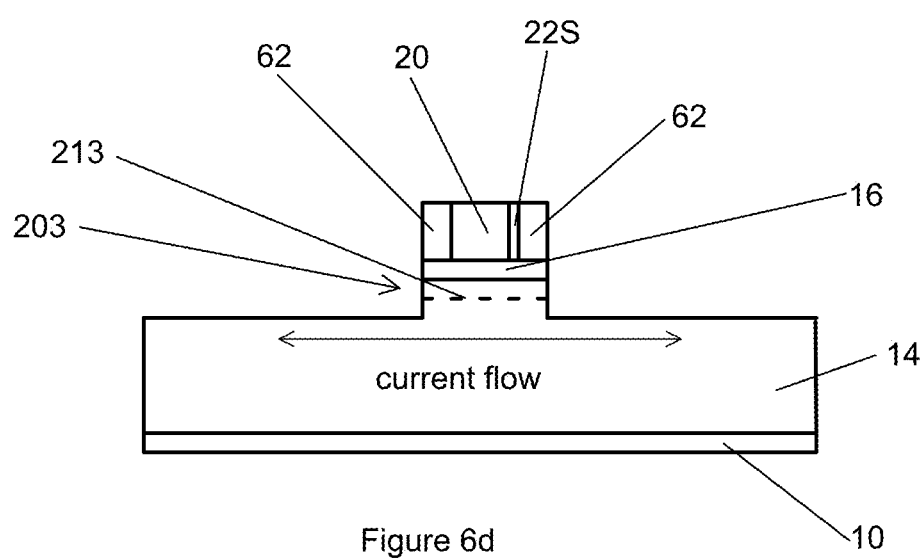

In some embodiments of both symmetric and asymmetric gate locations, additional sidewalls 62 can be formed on the sides of sacrificial gate 20 and/or sidewall 22S by deposition, such as by PECVD deposition of SiN or $SiO_2$ deposited conformally on all surfaces (deposition can occur on both horizontal and vertical surfaces, with roughly equal deposition rate) followed by an anisotropic $CF_4$ dry etch (or other fluorine-based dry etch) to remove dielectric preferentially from horizontal surfaces over vertical surfaces such as sidewalls, as shown in FIG. 6a (symmetric gate location) (FIG. 6b is a section through the location of Section B-B of FIG. 1b at the same point of manufacture as FIG. 6a) and FIG. 6d (asymmetric gate location). (FIG. 6c is a cross-sectional view through the middle of FIG. 6a.) The etch of horizontal surfaces forms the contact forming face 60, such as shown in FIG. 6a. Shown in FIG. 6a is a vertical face on the fin 203 that can in various embodiments extend up along layer 16 and sidewall 62 and can extend over the entire side of or only a portion of the fin 203, the side of layer 16 and/or sidewall 62. Contact forming face 60 can be formed on one side of fin 203 or both sides of fin 203.

Figure 7A:
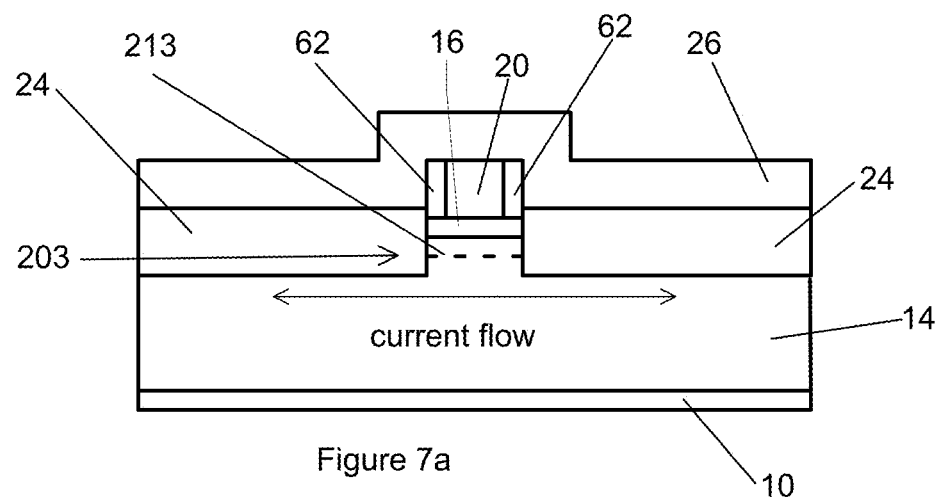
FIGS. 7a-7d are sections of partially fabricated embodiments of HEMTs as disclosed herein taken through various locations for various versions of devices.
Figure 7B:
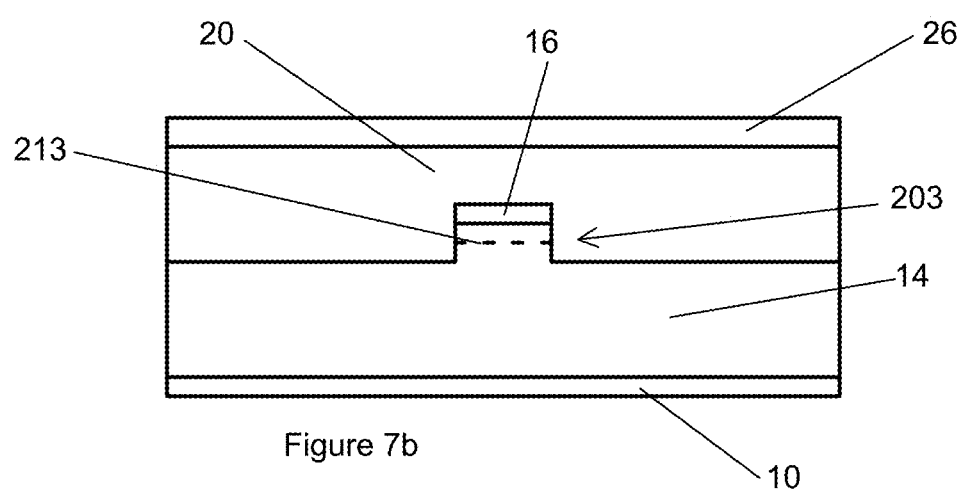
Figure 7C:
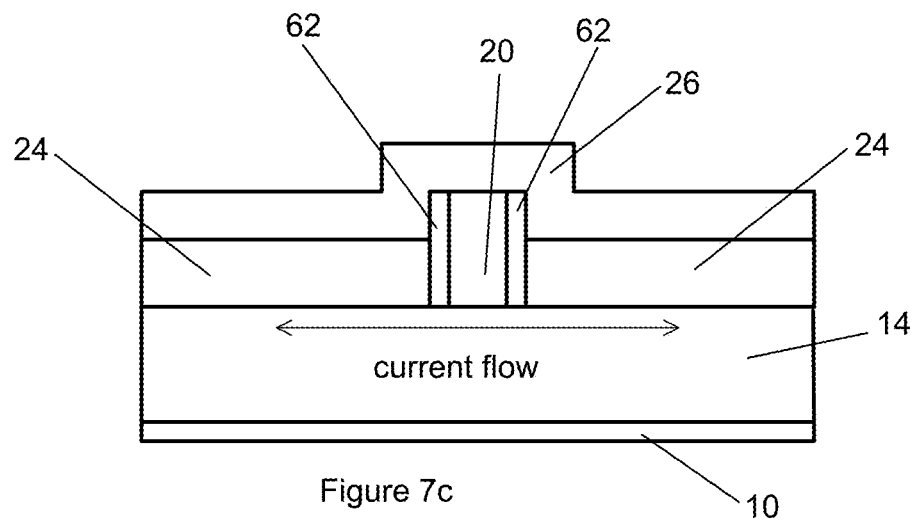
Figure 7D:
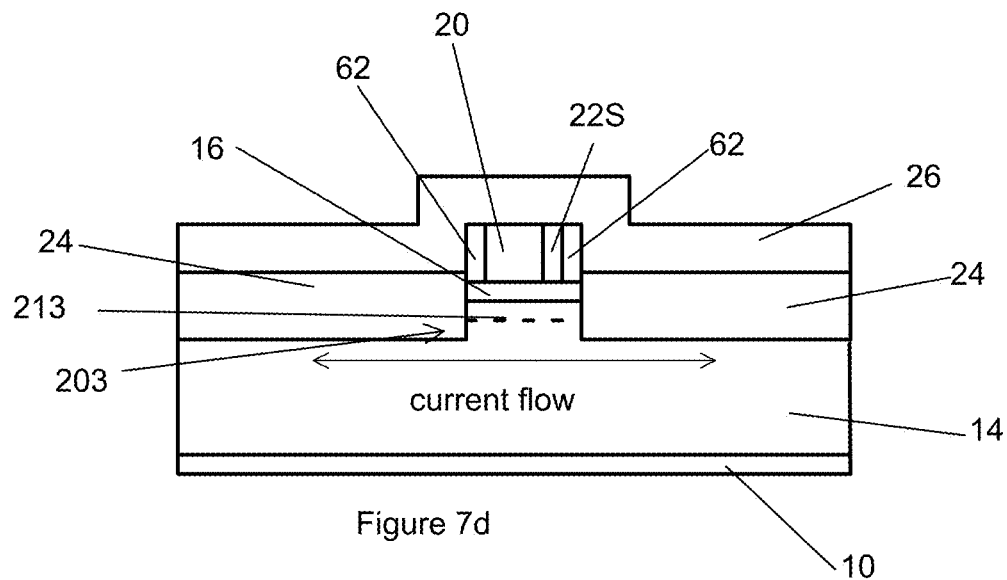

Contacts 24 can be formed by selective regrowth of an n+ material (preferably n+GaN, but other suitable contact materials can be utilized as well). As shown in FIG. 7a, one or both of contact 24 can be grown such that a contact face 63 of contact 24 is formed at the contact forming face 60. In some embodiments, such as that shown in FIG. 7a, contact 24 can optionally extend to layer 16 and optionally extend above layer 16 and to a location along sidewall 62 or extend to the top of sidewall 62. In various embodiments, one or both contacts 24 can be regrown to have a contact face 63 along one or both contact forming faces 60. The n+ material (preferably n+GaN) contacts 24 can produce lower contact resistances than do conventional alloyed metal contacts and also enable shorter source to drain/gate to gate distances than do conventional alloyed metal contacts. The n+ material (preferably n+GaN) 24 is preferably heavily (or highly) doped with Si (preferably doped with a doping level greater than $5 \times 10^{19}$ $cm^{-3}$) and therefore the heavily (or highly) doped n+ material has a very low resistance allowing it to function as a contact, namely, as a drain contact on the drain side (to the right of island 20 in FIG. 7a (symmetric gate) or FIG. 7c (asymmetric gate)) and as a source contact on the source side (to the left of island 20 in FIG. 7a (symmetric gate) or FIG. 7c (asymmetric gate)). Due to the low resistance of the Si-doped n+GaN preferably used for contacts 24, the electric field is mostly confined in between the gate and the n+GaN on the drain side of the gate; therefore, a gate-to-drain dimension ($L_{gd}$) can be defined by the presence of the Si-doped n+GaN 24 on the drain side of the gate. FIG. 7b is a cross-sectional view through the middle of FIG. 7a. FIG. 7c is a section through the location of Section B-B of FIG. 1b at the same point of manufacture as FIG. 7a.

Figure 8A:
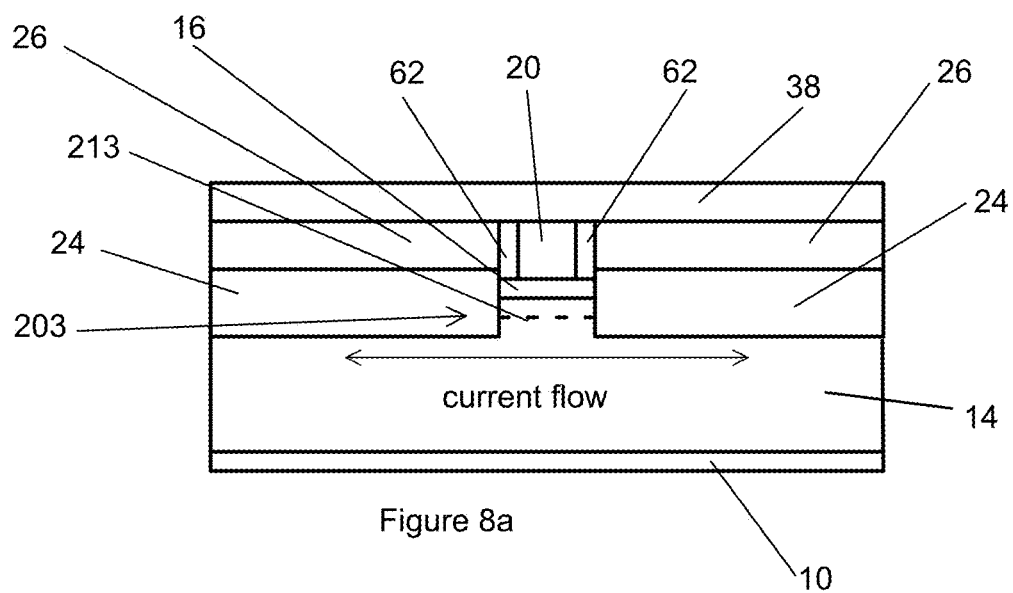
FIGS. 8a-8d are sections of partially fabricated embodiments of HEMTs as disclosed herein taken through various locations for various versions of devices.
Figure 8B:
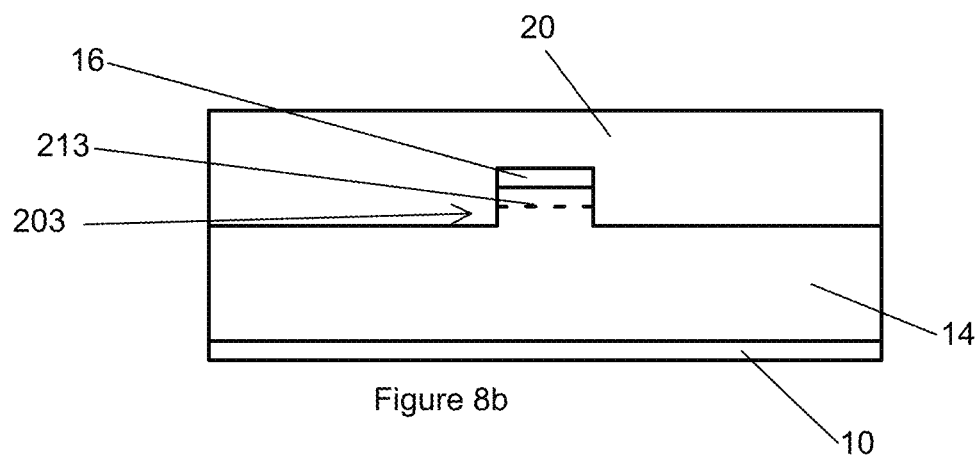
Figure 8C:
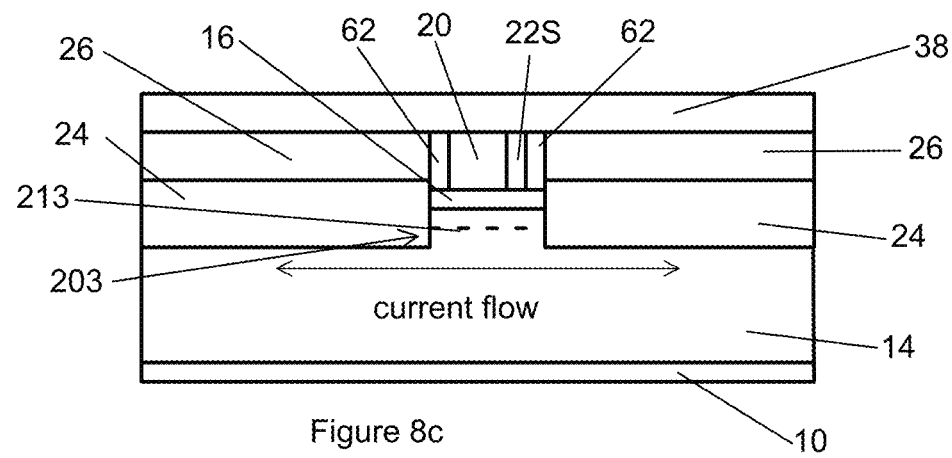
Figure 8D:
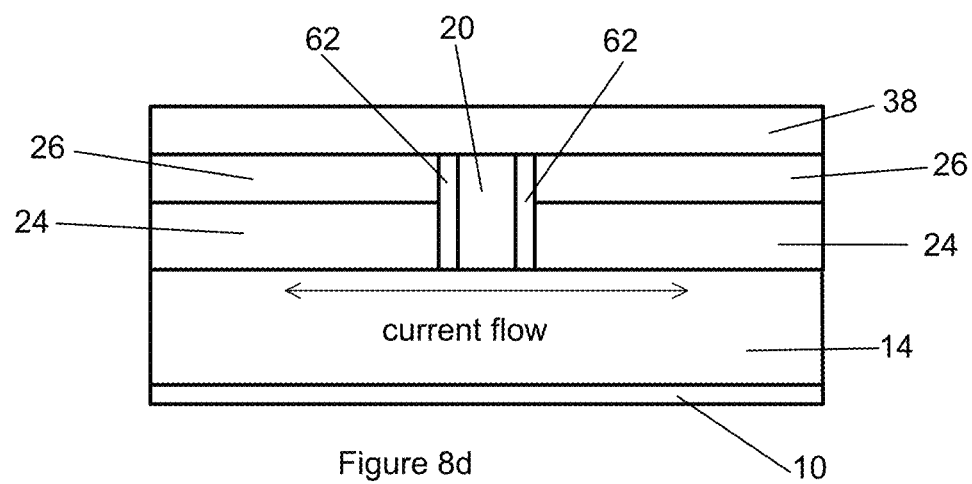

The n+ material (preferably n+GaN) contacts 24 can make contact with layer 14 where layer 14 is horizontal and/or by butting against and an edge of layer 14, as shown in FIG. 7a. Contacts 24 may be formed of materials such as n+GaN, n+InN, n+InGaN or other appropriate material and may be formed by MBE or MOCVD or other appropriate method. And, as will be seen, metal contacts 36 can be preferably formed on the n+ material contacts 24 during later processing steps. In various embodiments, the thickness of the n+ material contacts 24 depend on the growth rate and growth time of the n+ material, and the thickness can be grown to a sufficient thickness to provide sufficient conductivity for the device. Then a dielectric layer 26 can be deposited, which dielectric layer 26 may comprise Si, SiON, $HFO_2$, $ZrO$, $TiO_2$, using a deposition technique such as CVD, sputtering, ALD, etc, to a desired thickness which allows for planarization & CMP (Chemical Mechanical Polishing) to planarize the surface to form a smooth outer surface followed by the optional deposition of dielectric layer 38 seen in FIG. 8a (symmetric gate) and FIG. 8c (asymmetric gate.) FIG. 8b is a crossectional view through the middle of FIG. 8a. FIG. 8d is a section through the location of Section B-B of FIG. 1b at the same point of manufacture as FIG. 8a. An annealing step may be optionally used to condense the layer 26 to inhibit it from being significantly etched during the wet etching of island 20 which can preferably occur next. The previously formed sacrificial gate island 20 is removed along with dielectric material 38 (if present), preferably by a wet etch, leaving an opening 27 (see FIG. 9a, with FIG. 9b being a cross-sectional view through FIG. 9a, and FIG. 9c being a top view of the device in FIGS. 9a and 9b; the asymmetric version of the gate would look similar, but with an added sidewall 22S), but this wet etch preferably does not etch the sidewall 22S formed from dielectric layer 22 or layer 26 in any significant way. When the sacrificial gate 20 is removed, a gate forming surface 64 is formed along sidewall 62 (FIG. 9a) or along sidewall spacer 22S when present, such as for an asymmetric gate.

Figure 9A:
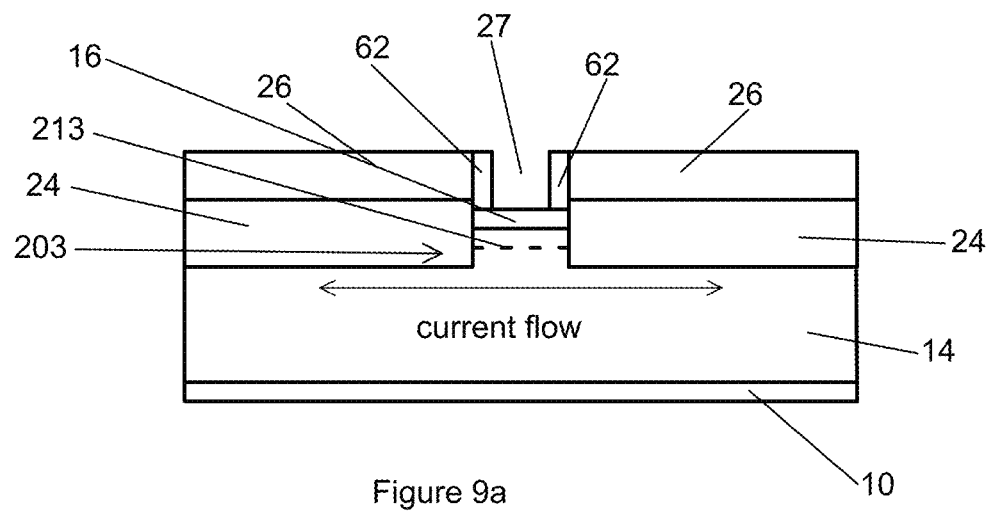
FIGS. 9a, 9b and 9c are sections of a partially fabricated embodiment of a HEMT as disclosed herein taken through various locations for various versions of devices.
Figure 9B:
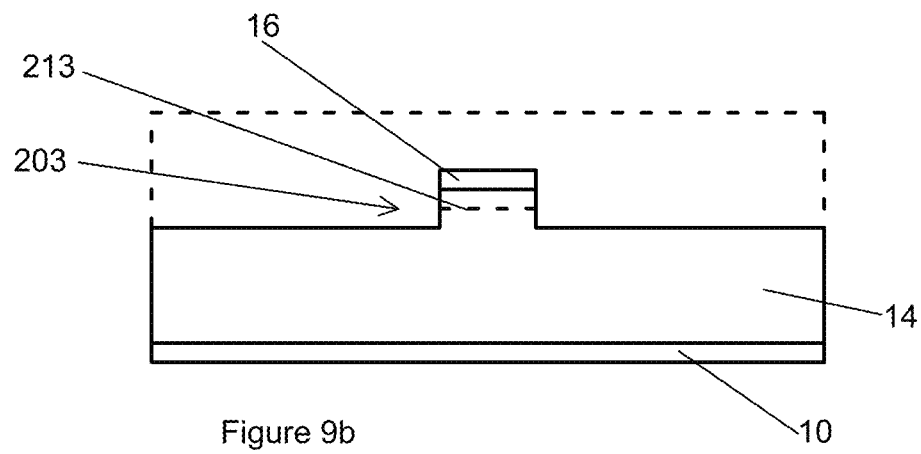
Figure 9C:
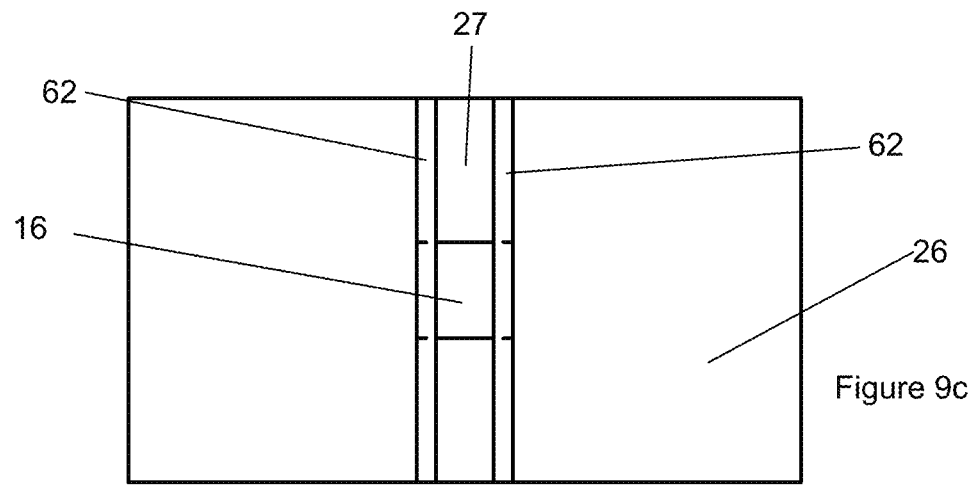
Figure 10A:
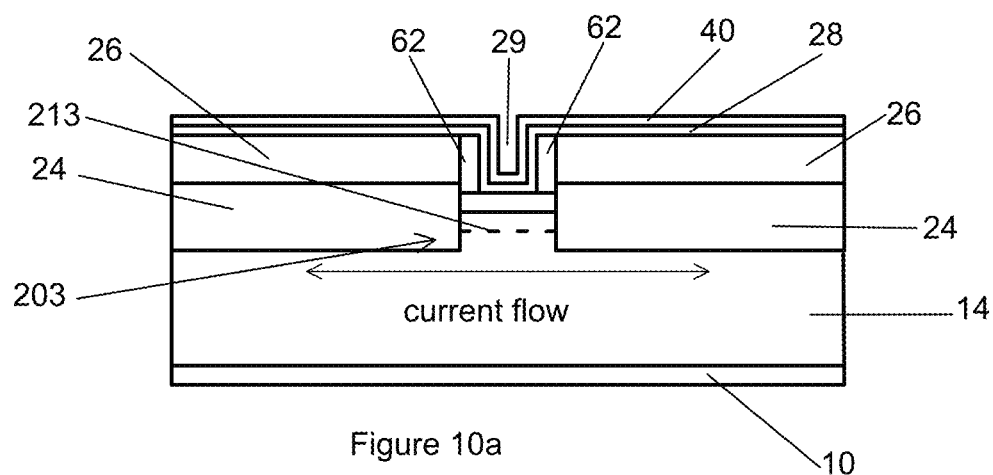
FIGS. 10a-10d are sections of partially fabricated embodiments of HEMTs as disclosed herein taken through various locations for various versions of devices.
Figure 10C:
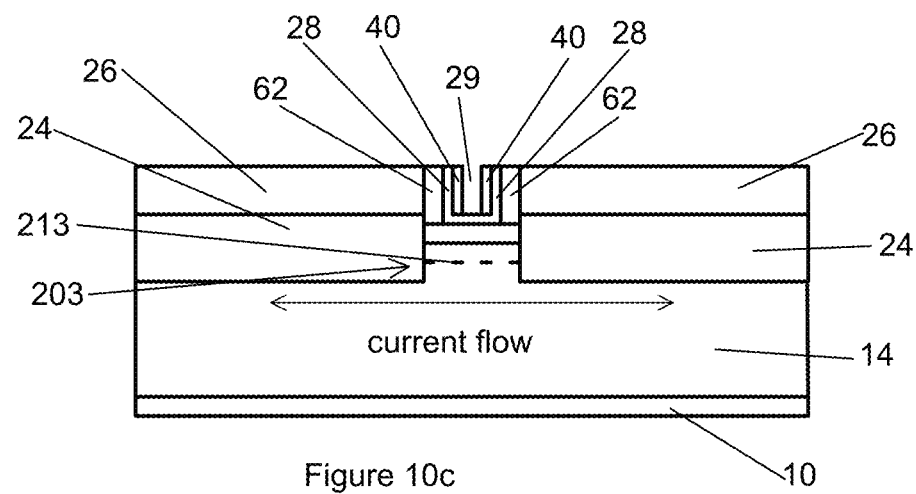
Figure 10D:
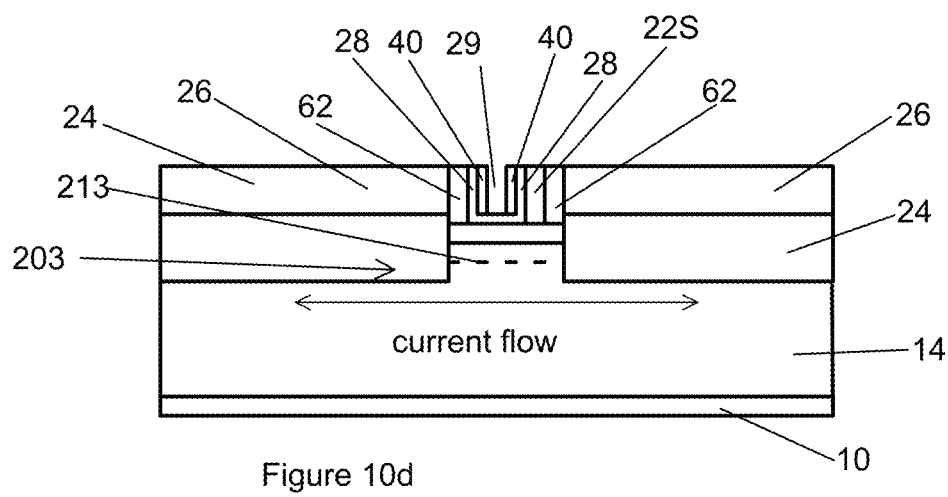
Figure 10B:
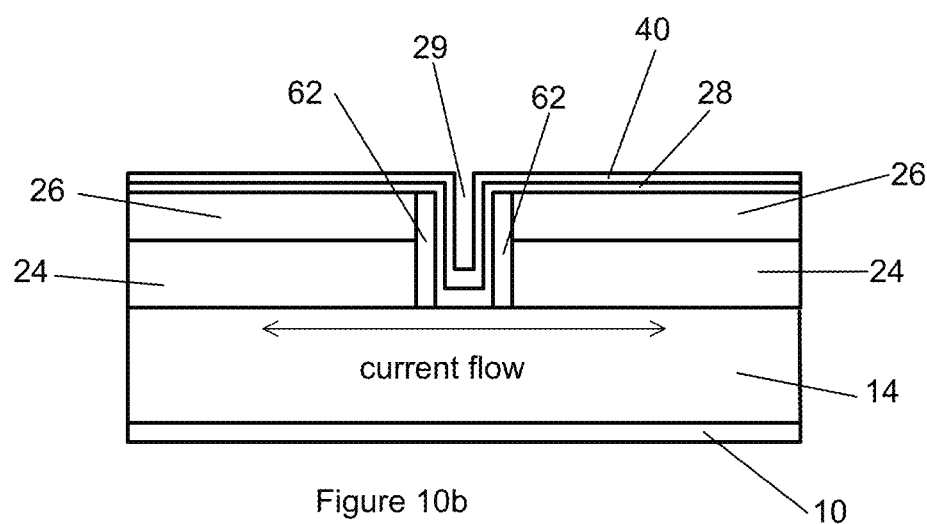

A dielectric layer 28, preferably formed of $SiO_2$ and/or preferably SiN is then formed, preferably by PECVD or ALD, followed by a second dielectric layer 40 on the exposed surface of the structure shown in FIG. 9a and in the previously defined opening 27, resulting in the structure as depicted in FIG. 10a (symmetric gate) with FIG. 10b a section through the location of Section B-B of FIG. 1b at the same point of manufacture as FIG. 10a. Layer 28 can be formed along a gate forming face 64 on the side of sidewall 62, the gate forming face 64 facing away from the contact forming face 60. Layer 28 can be used to form a pair of gate sidewalls preferably using an anisotropic dry etch (preferably ICP-RIE) to define the two sidewalls (see sidewalls 62L and 62R in FIG. 10c (symmetric gate) (and similarly for an asymmetric gate shown in FIG. 10d) from the previously deposited dielectric layer 28. This etch (the anisotropic ICP-RIE) also preferably removes the dielectric passivation layer (if used). This anisotropic etch leaves the new sidewall spacers 62L and 62R behind and dielectric passivation layer 223 (if used) while not etching optional epitaxial cap layer or layer 16 (if optional epitaxial cap layer is not utilized) exposing a gatefoot opening 29. The thickness of layer 28 should generally be in the range of 10 nm to 100 nm, but other dimensions can also be used. The anisotropic dry etch can be a fluorine-based dry etch, and is preferably ICP-RIE, using $CF_4$, $CHF_3$, or $SF_6$ gas or some combination thereof as the etchant at a chamber pressure of 3 mTorr at room temperature.

The thickness of layer 22 typically ranges between 50 nm and 300 nm while the thickness of layer 28 typically ranges between 10 nm and 100 nm. The thicknesses of layers 22 and 28 dictate the width of spacers 22S, 62L and 62R shown, for example, in FIG. 10c. The widths selected for these spacers (and hence the thicknesses of layers 22 and 28) will depend on a number of factors, including (i) the width of the gate stem $30_{STEM}$ (and hence the aspect ratio of the gate stem $30_{STEM}$—discussed in the following paragraph), (ii) the width of layers 16 and 18 at the gate foot, and (iii) the degree of asymmetry in terms of the gate stem's location relative to the drain and source contacts 24. As such, the thicknesses of layers 22 and 28 may fall outside the "typical" ranges given above.

Figure 11A:
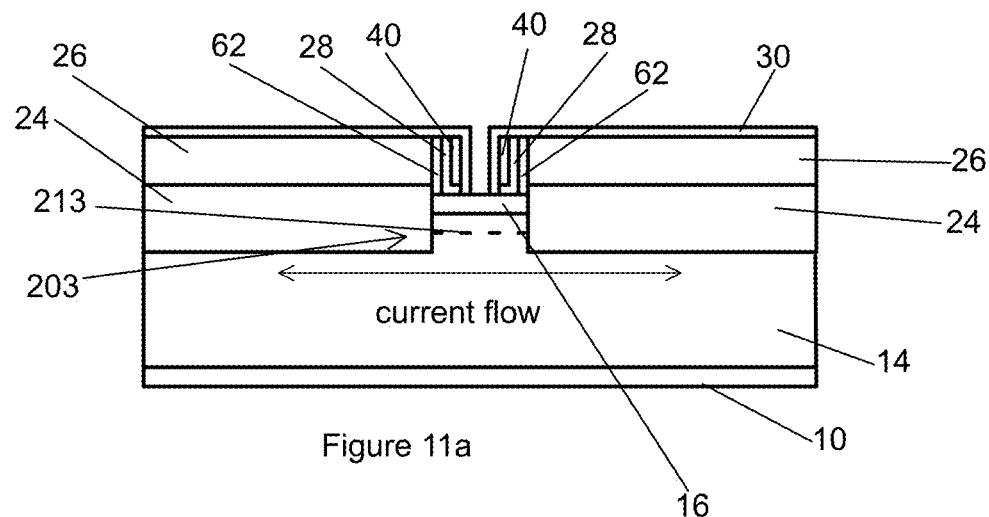
FIGS. 11a-11b are sections of partially fabricated embodiments of HEMTs as disclosed herein taken through various locations for various versions of devices.
Figure 11B:
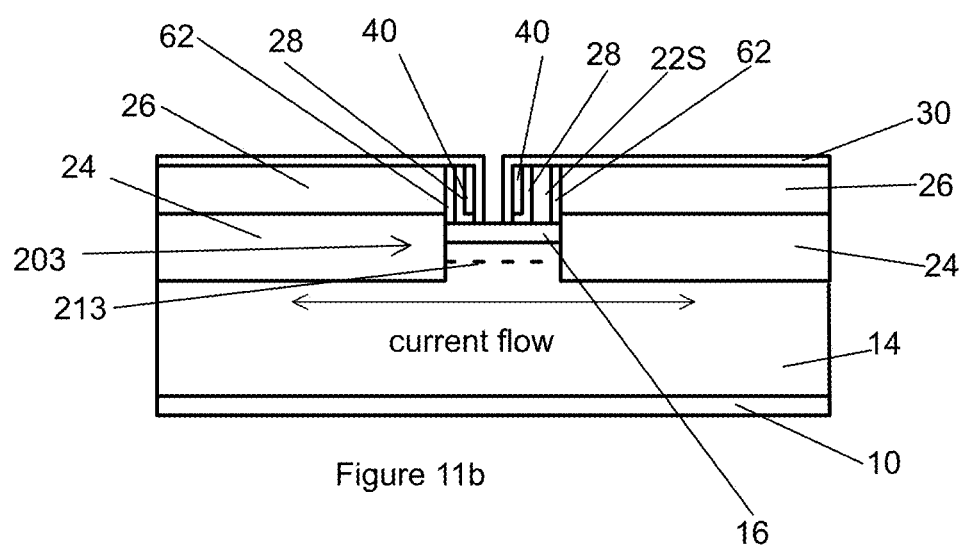
Figure 12:
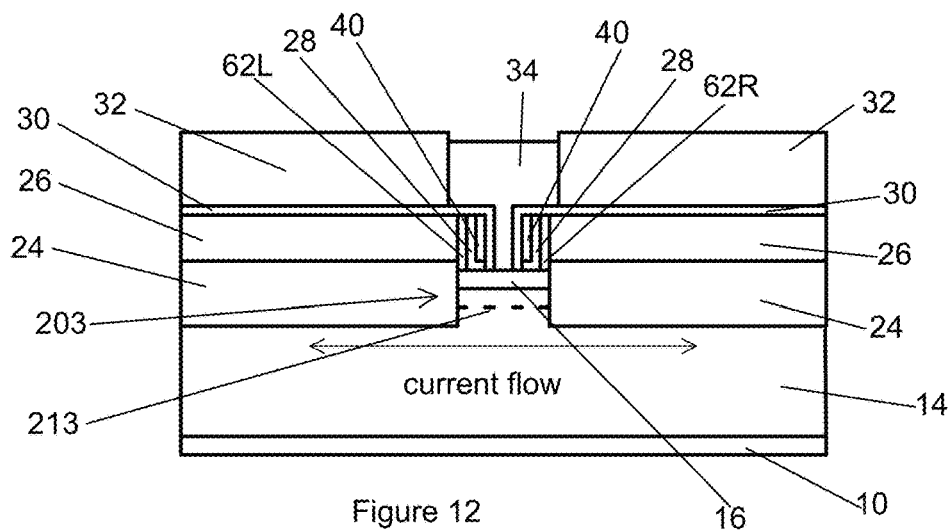
FIG. 12 is a section of a partially fabricated embodiment of a HEMT as disclosed herein taken through the location of Section A-A as shown in FIG. 1b.

The gate foot opening 29 can then be metalized by thermal or plasma enhanced ALD using metals such as Pt, Ir for the metallization 30 as depicted by FIGS. 11a (symmetric gate), and 11b (asymmetric gate) to form metal on the previously exposed portion of the upper barrier layer 16 (or optional epitaxial cap layer if it exists), which metal extends upwardly forming the stem of what will be a T-shaped gate. In the embodiment shown in FIG. 11a, the location of metallization 30 and with subsequent processing, gate foot 30F, is along layer 40, the location of which was determined by layer 28 (and/or sidewall spacer 22S—See FIG. 11b), the location of which was determined by the gate forming face 64, the location of which was determined by the sacrificial gate 20, while the location of contact 24 was determined by the location of sidewall 28 which was determined by the sacrificial gate 20. Accordingly, the sacrificial gate can determine the location of contact face 63 as well as the location of the face of the gate foot/gate stem facing contact face 63, making the gate and contact self-aligning. A very narrow gap can be seen in stem which gap is a possible byproduct of using ALD to form the stem of the gate. If the gate metal is deposited with the thickness more than 2× the size of the gap between sidewalls 62L and 62R, then the depicted narrow gap in the stem is completely eliminated. But if the narrow gap does occur, that gap is later filled with metal (Au) as shown in FIG. 12, when gate head 34 of the T-shaped gate is formed. Either way the resulting stem $30_{STEM}$ (see, for example, FIG. 13a (symmetric) and FIG. 13b (asymmetric)) can have a high aspect ratio (stem height divided by its width) greater than 10-20 when ALD is used to form the gate stem $30_{STEM}$. A high aspect ratio stem (greater than 10) can be desirable since such a ratio moves gate metal (particularly the gate head 34 discussed below) away from the semiconductor layers (such as the channel layer 14) thereby reducing capacitance between the gate and the semiconductor layers. Using ALD, as discussed herein, to form the gate stem $30_{STEM}$ allows for much taller gate heights with reduced gate stem widths compared to prior art T-shaped gate construction techniques.

Figure 13A:
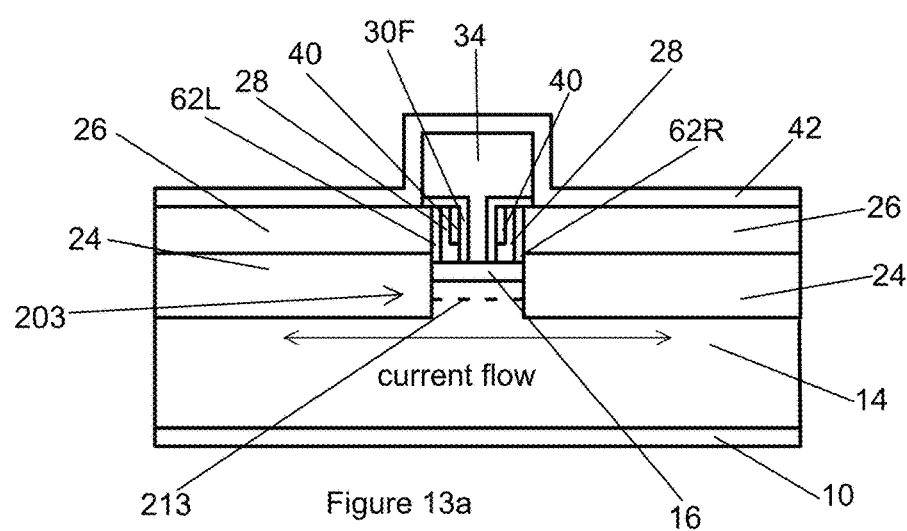
FIGS. 13a-13c are sections of partially fabricated embodiments of HEMTs as disclosed herein taken through various locations for various versions of devices.
Figure 13B:
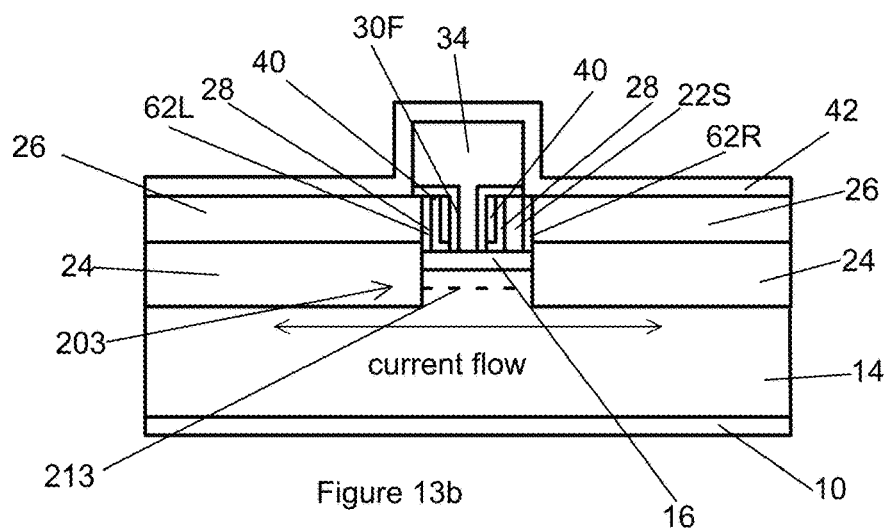
Figure 13C:
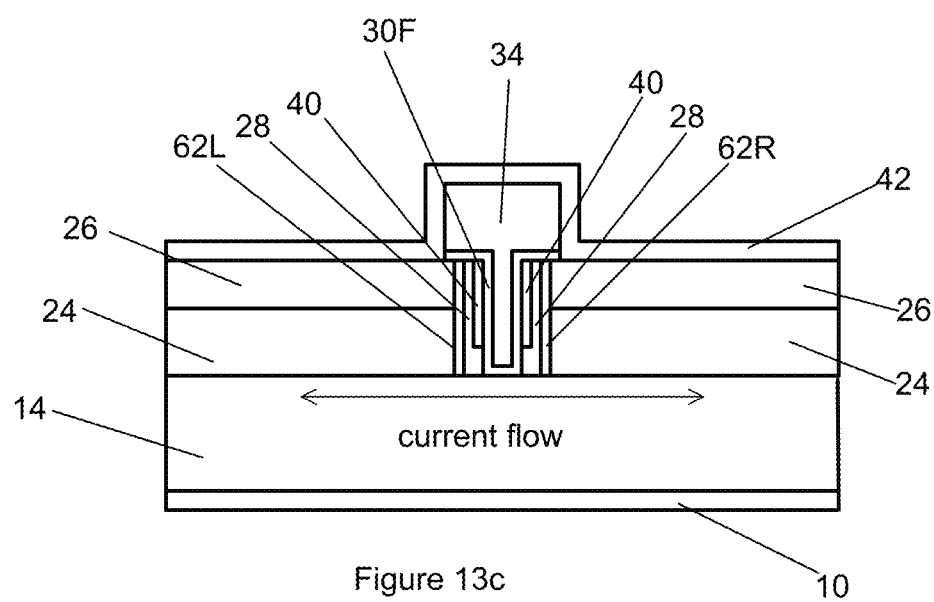

As can be seen by reference to FIG. 12, the gate head 34 can next be formed by first applying a mask 32, preferably a PMMA mask, which can be patterned using lithographic techniques and an opening formed therein which can then be metallized preferably by electroplating using the previously formed metal 30 in the gatefoot opening 29 as plating base for this added (new) metal which forms the gate head 34. Gate head 34 can be formed of Au or other appropriate metal, and that metal used for 34 can typically fill in any gap occurring in the stem of the gate. The mask 32 can then be removed by a resist remover (stripper) such as Acetone or N-Methylpyrrolidone (NMP). Then the exposed portions of layer 30 can be removed by ion-milling, resulting in the structure depicted by FIG. 13a (symmetric) or 13b (assymetric) with the metallic gate foot 30 F comprising the remaining portion of layer 30, particularly the remaining portion of layer 30 which defines the stem $30_{STEM}$ of a T-shaped gate. Optional dielectric layer 42 can also be deposited over the exposed surfaces, such as shown in FIGS. 13a and 13b. FIG. 13c shows a section through the location of Section B-B of FIG. 1b at the same point of manufacture as FIG. 13a.

Figure 14A:
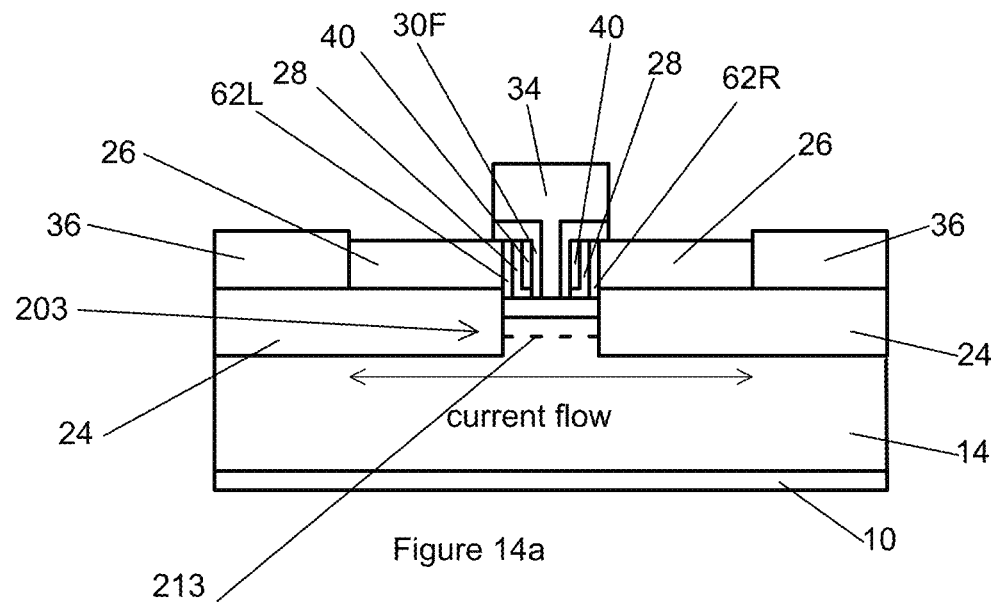
FIGS. 14a and 14b are sections of partially fabricated embodiments of HEMTs as disclosed herein taken through various locations for various versions of devices.
Figure 14B:
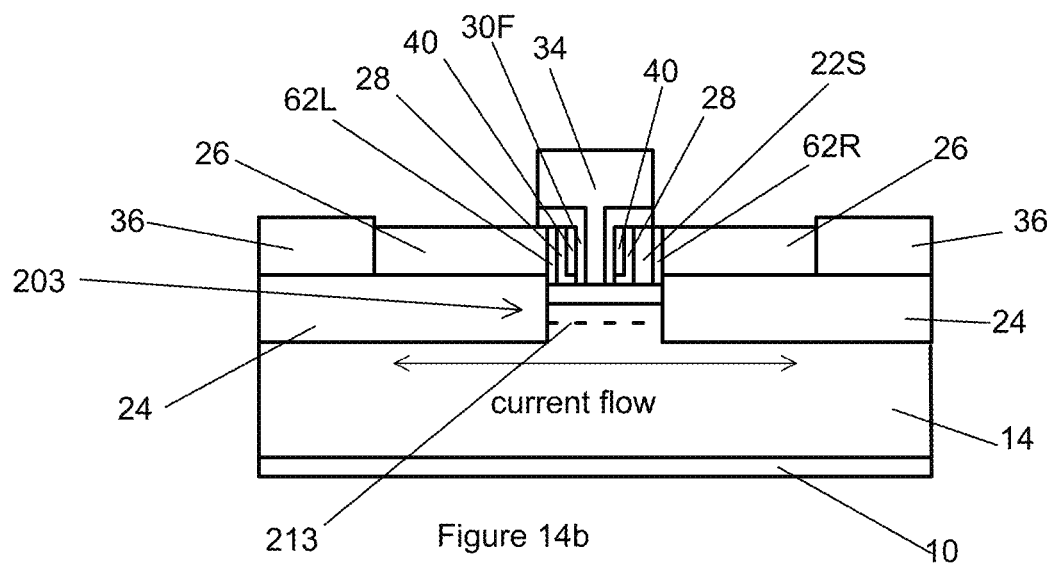

Turning to FIGS. 14a (symmetric gate) and 14b (asymmetric gate), openings for ohmic contacts 36 can preferably be defined by first forming openings in dielectric layer 26 using a mask defined using standard lithographic techniques and then employing a RIE/ICP-RIE etch to cut the openings into the dielectric layer 26. Those openings can then be filled with metal using standard lithographic techniques, metal evaporation, and lift-off. The metal preferably consists of Au on top of Pt, but other metals and metal combinations used for ohmic contacts can be used as well. The gate head can be protected with photoresist (not shown) used for the just mentioned mask as the photoresist preferably covers the gate head layer 34 during the opening etching process, as well as the ohmic metal evaporation and lift-off processes used to form the ohmic contacts 36.

The sidewall spacer 22S, sidewalls 62L and 62R and the remaining portions of layer 26 and additional sidewalls 62 can then be preferably removed, preferably by a wet etch, and a gate dielectric passivation layer, preferably formed of SiN, or $Al_2O_3$, or $HfO_2$, or AlN, can then be preferably formed over the exposed surfaces preferably by plasma enhanced chemical vapor deposition or atomic layer deposition (ALD). Since the these layers are all dielectric, they could remain in the finished device, but their presence would then add some capacitance to the resulting device which is likely to be considered as being undesirable in most applications of the device.

Figure 15A:
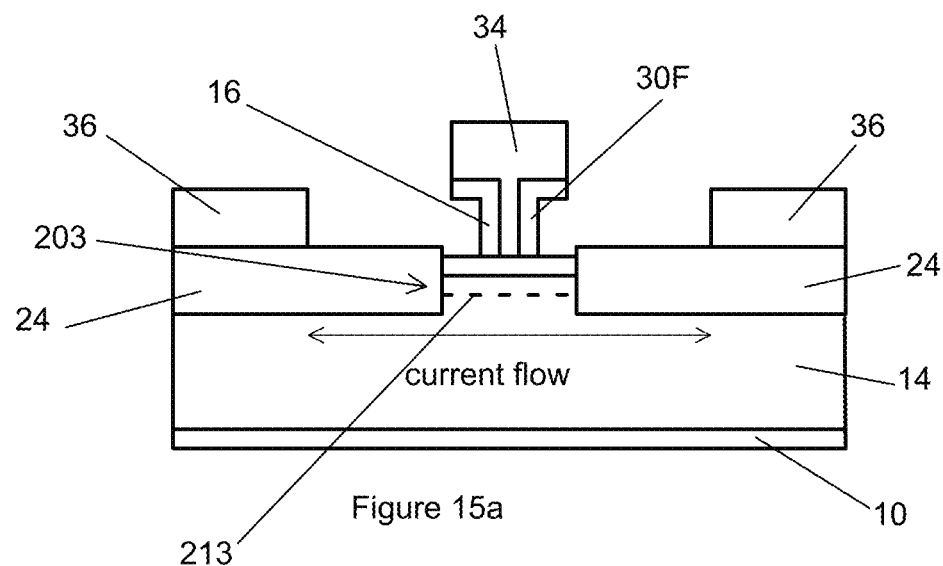
FIGS. 15a and 15b are sections of embodiments of HEMTs as disclosed herein taken through various locations for various versions of devices.
Figure 15B:
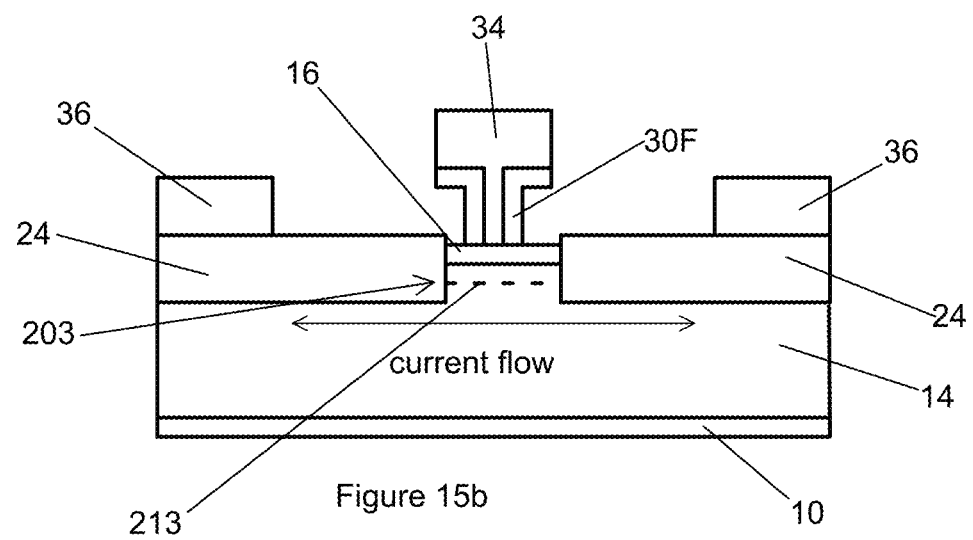

It should be noted that the stem $30_{STEM}$ of the gate foot 30 F can be disposed symmetrically or asymmetrically with regard to the sides 24 S of the n+ regrown layer 24 as can be seen in FIGS. 15a and 15b. This is due to the fact that more sidewalls/sidewall spacers 22S, 62R (two in this embodiment) formed on the right hand side of the gatefoot opening 29 for an asymmetric gate than are formed on the left hand side of the gatefoot opening 29 (where only one sidewall spacer 62L is formed in this embodiment). Of course, the processing described can also form a mirror image of that which is shown in FIG. 15b with more spacers on the left than occur on the right hand side of FIG. 13b and the processing described can also form a symmetric structure as shown in FIG. 15a by eliminating the sidewall 22S as shown in FIG. 13b. It can be important, in some of these asymmetrical embodiments, to have the gate foot (stem) disposed asymmetrically with respect to the sides 24 S of layer 24 so that a relatively short gate-to-source distance (the distance between the gatefoot and the left side of layer 24 in this embodiment) is used to reduce the source resistance, to increase the drain current, while the relatively longer gate-to-drain distance (distance between the gate foot and the right side of layer 24) is used to increase the breakdown voltage, reduce the gate-to-drain capacitance, and reduce the drain conductance.

The symmetric gate process can be suitable for applications such as for making a low-noise amplifier where a very low device on-resistance is required. When the gate stem is symmetric, the breakdown voltage is not as high as the asymmetric gate stem with the relatively longer gate stem-to-drain distance (compared to the gate stem-to-source distance). However the symmetric device can have a smaller drain resistance and a higher cutoff frequency than the asymmetric device, which can make the device more suitable for low DC power, low-noise amplifier applications.

One advantage of the present invention which is applicable to both the asymmetric embodiment of FIG. 15b and the symmetric embodiment of FIG. 15a, is that the location and width of the stem $30_{STEM}$ of the T-shaped gate can be both aligned and controlled by the width of the island 20 and the thicknesses of layer 22 (if used) and layer 28 (if used).

Figure 16:
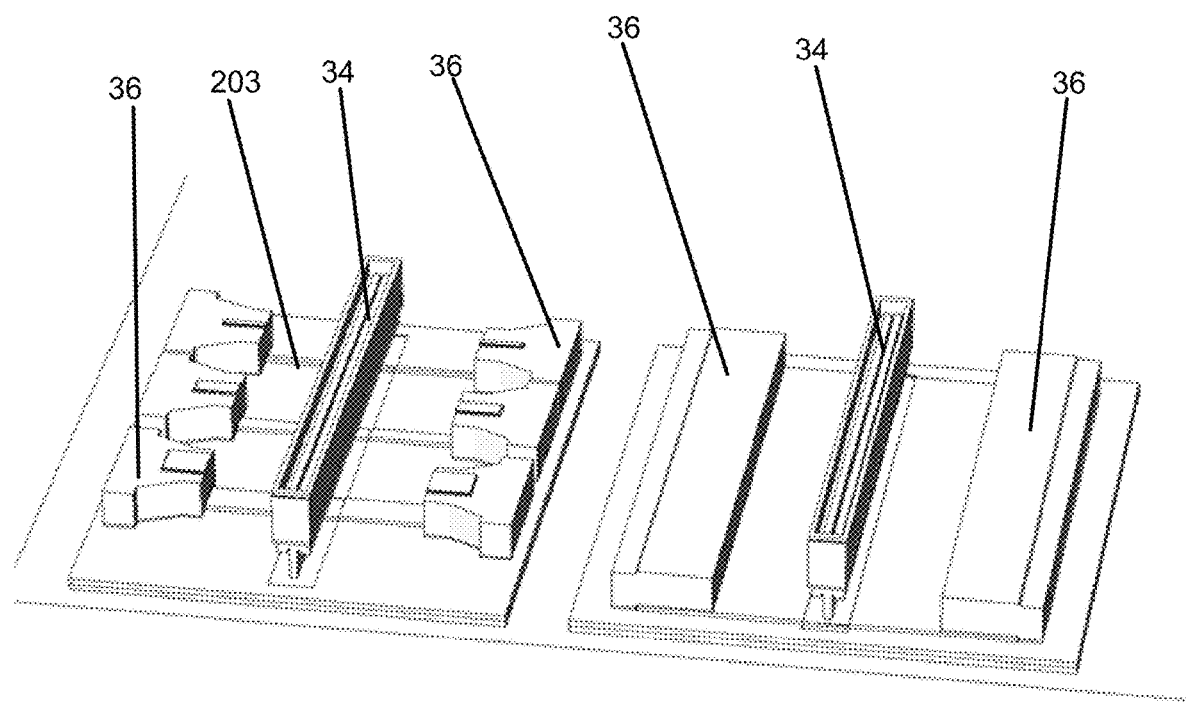
FIGS. 16-20 are sections of embodiments of HEMTs as disclosed herein taken through the location of Section A-A as shown in FIG. 1b.
Figure 17:
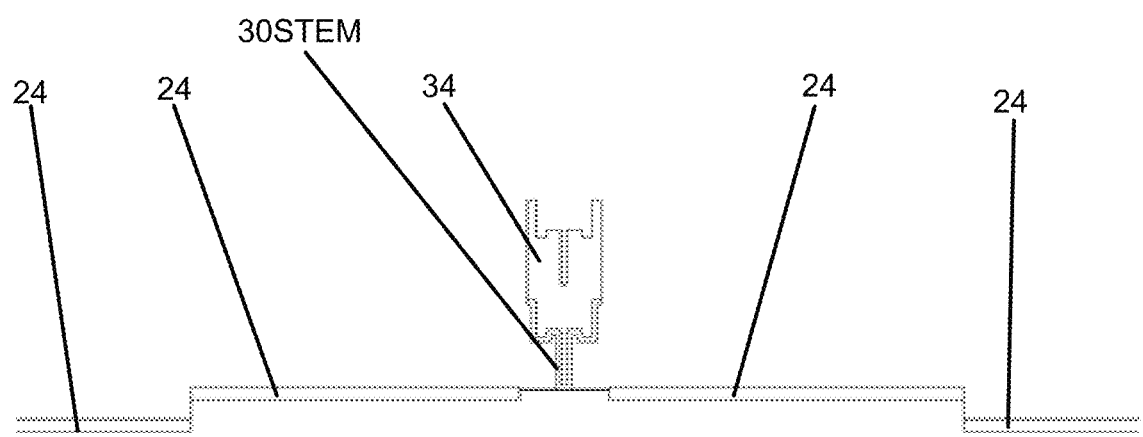
Figure 18:
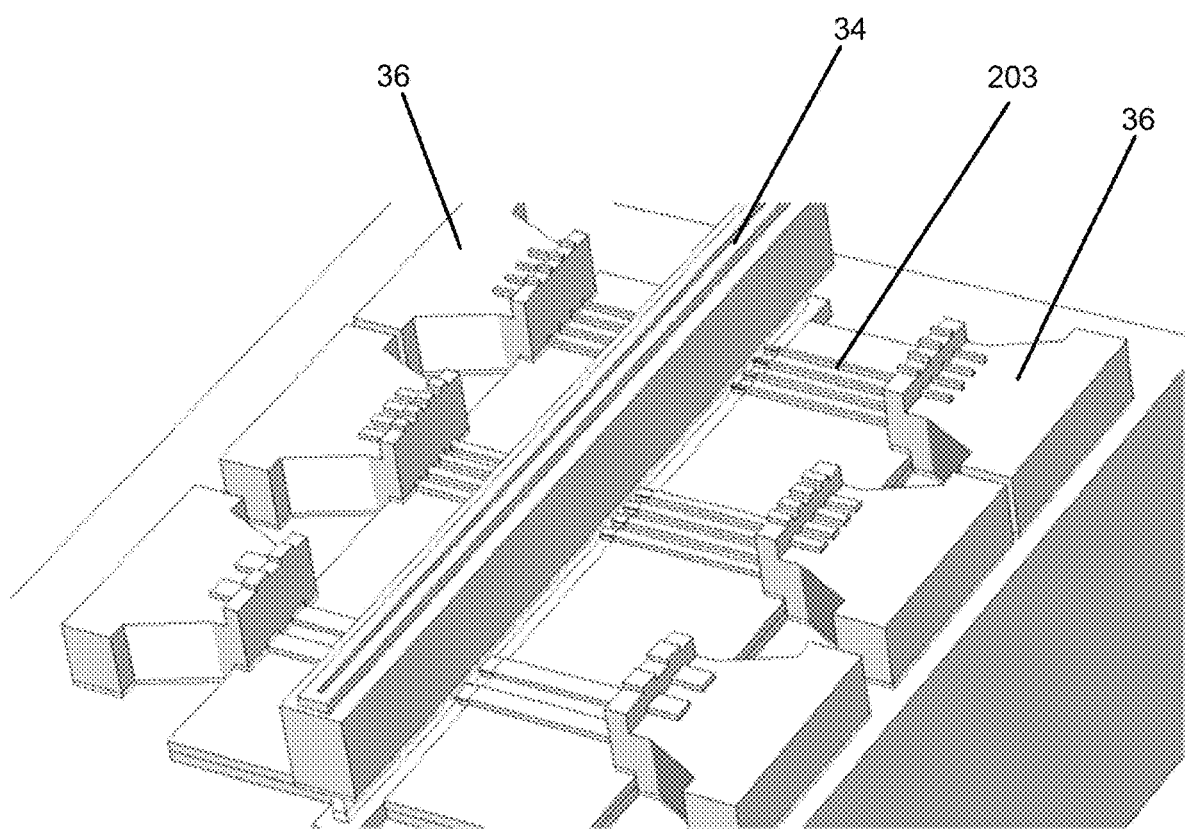
Figure 19:
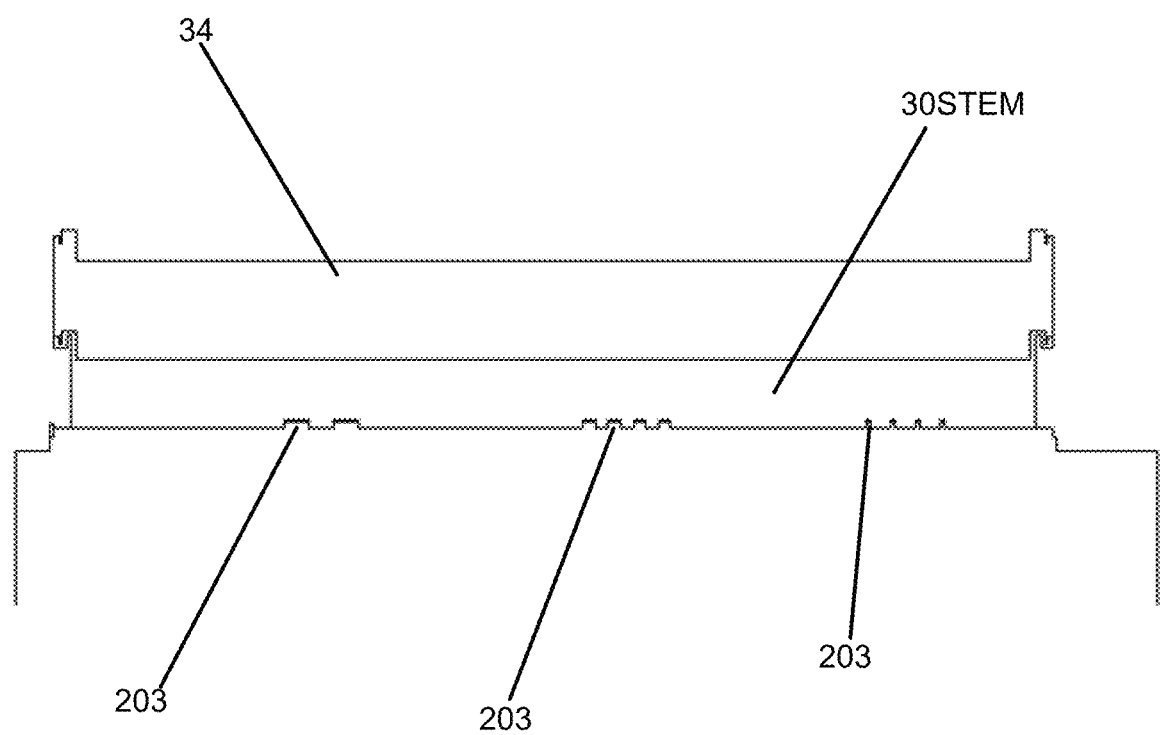
Figure 20:
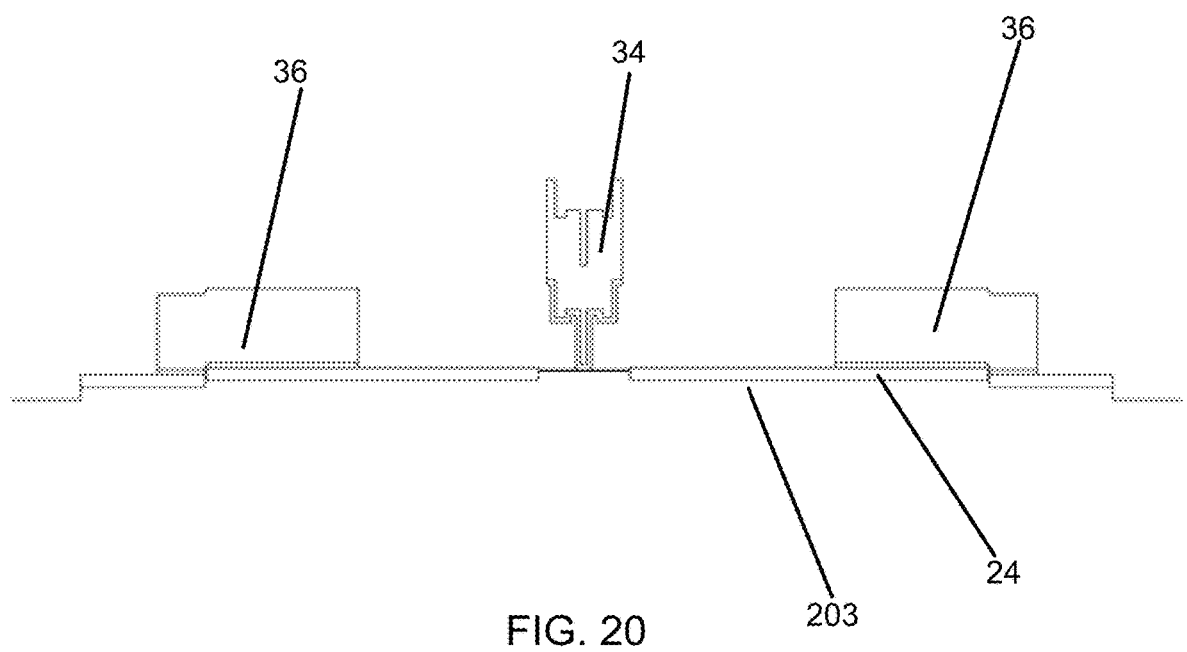

Additional views of devices which could be made according to the methods disclosed herein are shown in FIGS. 16-20. FIG. 16 shows a perspective view of a FinFET HEMT fabricated next to a planar FinFET. FIG. 17 shows an end view of a FinFET device showing the fin 203 and gate 54. FIG. 18 shows a perspective view of a FinFET HEMT where a block of two fins 203, a block of four fins 203 and a block of four fins 203 are manufactured onto the same device and have a common gate 54.

Figure 21A:
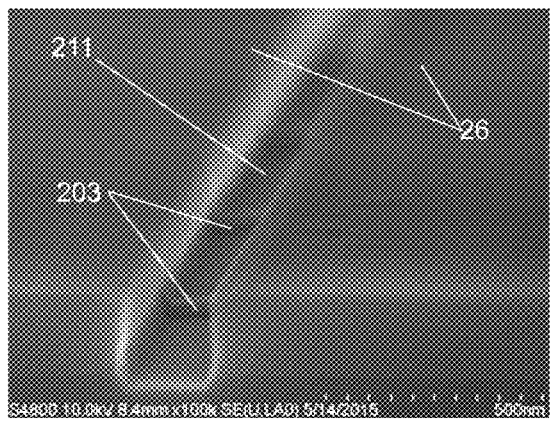
Figure 21B:
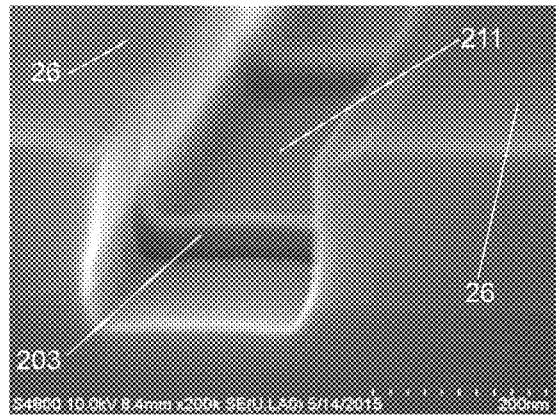
Figure 21C:
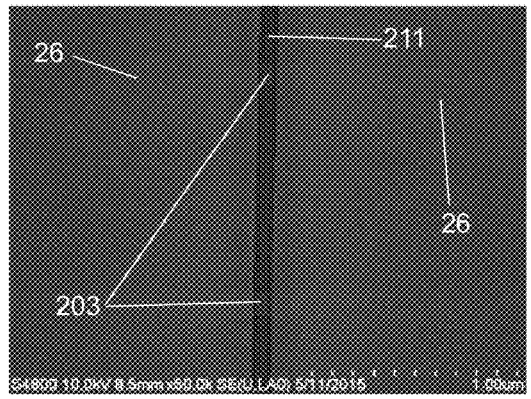
Figure 21D:
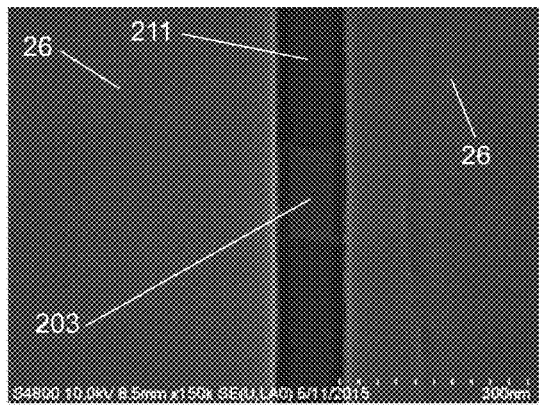

FIGS. 21a and 21d are scanning electron micrographs (SEMs) of partially fabricated FinFET HEMT devices with a gate opening on the fin structure after the sacrificial gate has been removed, showing both plan views and perspective views.

Figures 22A, 22B, 22C:
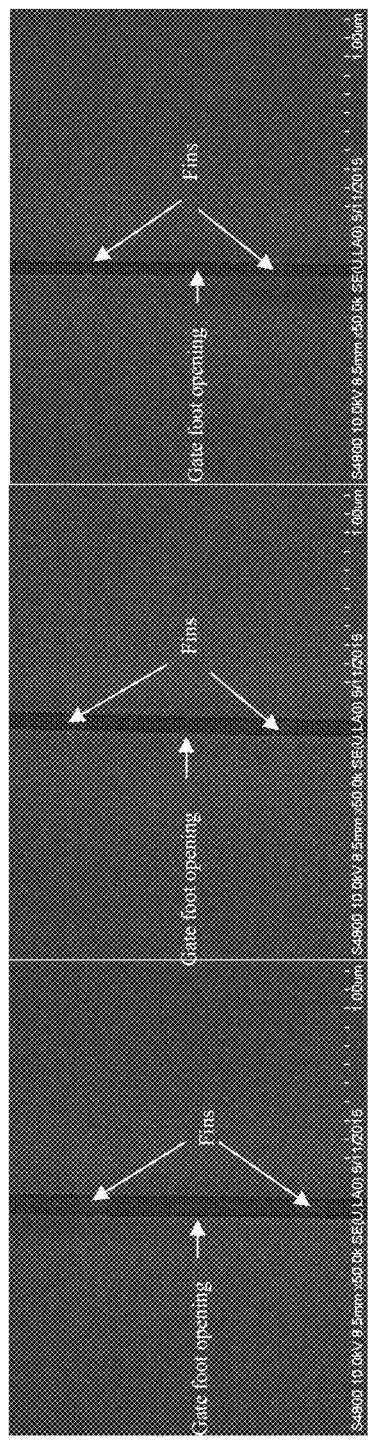
FIGS. 22a-22c are SEMs of partially fabricated embodiments of HEMTs as disclosed herein.

FIGS. 22a, 22b and 22c show SEMs of partially fabricated FinFET HEMT devices with differing fin widths.

Modifications, additions, or omissions may be made to the systems, apparatuses, and methods described herein without departing from the scope of the inventive concepts. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A method of making a finned field effect transistor (FinFET) high electron mobility transistor (HEMT) device comprising:
   forming a self-aligned gate by a self-aligned fabrication process, wherein the gate and/or one or more gate sidewalls define the gate-source or gate-drain spacing, the self-aligned fabrication process comprising:
   forming a sacrificial gate across a fin, wherein the fin comprises an HEMT channel layer;
   adding a first of the one or more gate sidewalls to a first side of the fin facing a source and a second of the gate sidewalls to a second side of the fin facing a drain, wherein a source-facing side of the first gate sidewall is aligned with a source-facing side of the fin and a drain-facing side of the second gate sidewall is aligned with a drain-facing side of the fin;
   growing source and drain contacts on either side of the sacrificial gate, wherein the source or the drain contact is aligned with the respective source-facing side or the drain-facing side of the fin;
   forming a dielectric layer on the first and second gate sidewalls, the source and drain contacts and the sacrificial gate;
   chemical mechanical planarization (CMP) of the dielectric layer to an upper surface of the sacrificial gate;
   removing the sacrificial gate resulting in a gatefoot opening;
   forming a gate by steps comprising:
   metalizing the gatefoot opening; and
   forming a gate head over the metalized gatefoot opening; and
   forming source and drain ohmic contacts in electrical communication with the source and drain contacts, respectively.

2. The method of making a FinFET HEMT device of claim 1 further comprising depositing a dielectric material on the first and second dielectric walls after removal of the sacrificial gate and before metalizing the gatefoot opening.

3. The method of making a FinFET HEMT device of claim 1, wherein the fin comprises a GaN layer and a passivation layer is deposited between the substrate and the GaN layer.

4. The method of making a FinFET HEMT device of claim 1, wherein the fin is formed on a substrate and the substrate comprises silicon on insulator.

5. The method of making a FinFET HEMT device of claim 1, wherein the fin is formed on a substrate and the substrate is silicon carbide (SiC) or silicon.

6. The method of making a FinFET HEMT device of claim 1, wherein the fin comprises a GaN layer and a passivation layer is deposited on top of the GaN layer.

7. The method of making a FinFET HEMT device of claim 1, wherein the self-aligned fabrication process comprises e-beam patterned fins and e-beam patterned sacrificial gate.

8. The method of making a FinFET HEMT device of claim 1, wherein the gate structure has different gate-source and gate-drain fin lengths.

9. The method of making a FinFET HEMT device of claim 1, further comprising n+GaN ohmic contacts regrowth on the source and the drain.

10. The method of making a FinFET HEMT device of claim 1, wherein the gate has a T-head.

11. The method of making a FinFET HEMT device of claim 1, wherein the channel layer is formed from a layer of AlGaN contacting a layer of GaN.

* * * * *